US012712029B2

(12) United States Patent
Yabe

(10) Patent No.: US 12,712,029 B2
(45) Date of Patent: Aug. 18, 2026

(54) READ TECHNIQUES FOR NON-VOLATILE MEMORY

(71) Applicant: Sandisk Technologies, Inc., Milpitas, CA (US)

(72) Inventor: Hiroki Yabe, Yokohama (JP)

(73) Assignee: Sandisk Technologies, Inc., Milpitas, CA (US)

( * ) Notice: Subject to any disclaimer, the term of this patent is extended or adjusted under 35 U.S.C. 154(b) by 146 days.

(21) Appl. No.: 18/897,714

(22) Filed: Sep. 26, 2024

(65) Prior Publication Data

US 2026/0088104 A1 Mar. 26, 2026

(51) Int. Cl.

| | |
|---|---|
| ***G11C 16/04*** | (2006.01) |
| ***G06F 12/02*** | (2006.01) |
| ***G11C 16/08*** | (2006.01) |
| ***G11C 16/26*** | (2006.01) |
| *H10B 43/10* | (2023.01) |
| *H10B 43/27* | (2023.01) |
| *H10B 43/35* | (2023.01) |
| *H10W 90/00* | (2026.01) |
| *H10W 90/24* | (2026.01) |

(52) U.S. Cl.

CPC .......... *G11C 16/26* (2013.01); *G06F 12/0246* (2013.01); *G11C 16/0483* (2013.01); *G11C 16/08* (2013.01); *H10B 43/10* (2023.02); *H10B 43/27* (2023.02); *H10B 43/35* (2023.02); *H10W 90/00* (2026.01); *H10W 90/24* (2026.01)

(58) Field of Classification Search

CPC ..... G11C 16/26; G11C 16/0483; G11C 16/08; G06F 12/0246; H10B 43/10; H10B 43/27; H10B 43/35; H10W 90/00; H10W 90/24

USPC .................................................... 365/185.11

See application file for complete search history.

(56) References Cited

U.S. PATENT DOCUMENTS

| | | | | |
|---|---|---|---|---|
| 10,001,937 | B2 * | 6/2018 | Jung | G11C 16/30 |
| 11,392,322 | B2 * | 7/2022 | Kim | G06F 3/0604 |
| 12,424,285 | B2 * | 9/2025 | Tan | G11C 11/5642 |

* cited by examiner

*Primary Examiner* — Tha-O H Bui

(74) *Attorney, Agent, or Firm* — Dickinson Wright PLLC

(57) ABSTRACT

The memory device that includes a planes with memory blocks that have memory cells arranged in word lines. The memory device also includes circuitry that is configured to receive a read command for a selected memory block of the plurality of planes. The circuitry is also configured to determine a count of planes of the plurality of planes that have memory blocks undergoing a block activation process, which includes ramping the plurality of word lines to a pass voltage. In response to the count being below or equal to a predetermined threshold, the circuitry begins the block activation process for the selected memory block. In response to the count being above the predetermined threshold, the circuitry delays the block activation process for the selected memory block until the number of planes that have memory blocks undergoing the block activation process is below the predetermined threshold.

20 Claims, 20 Drawing Sheets

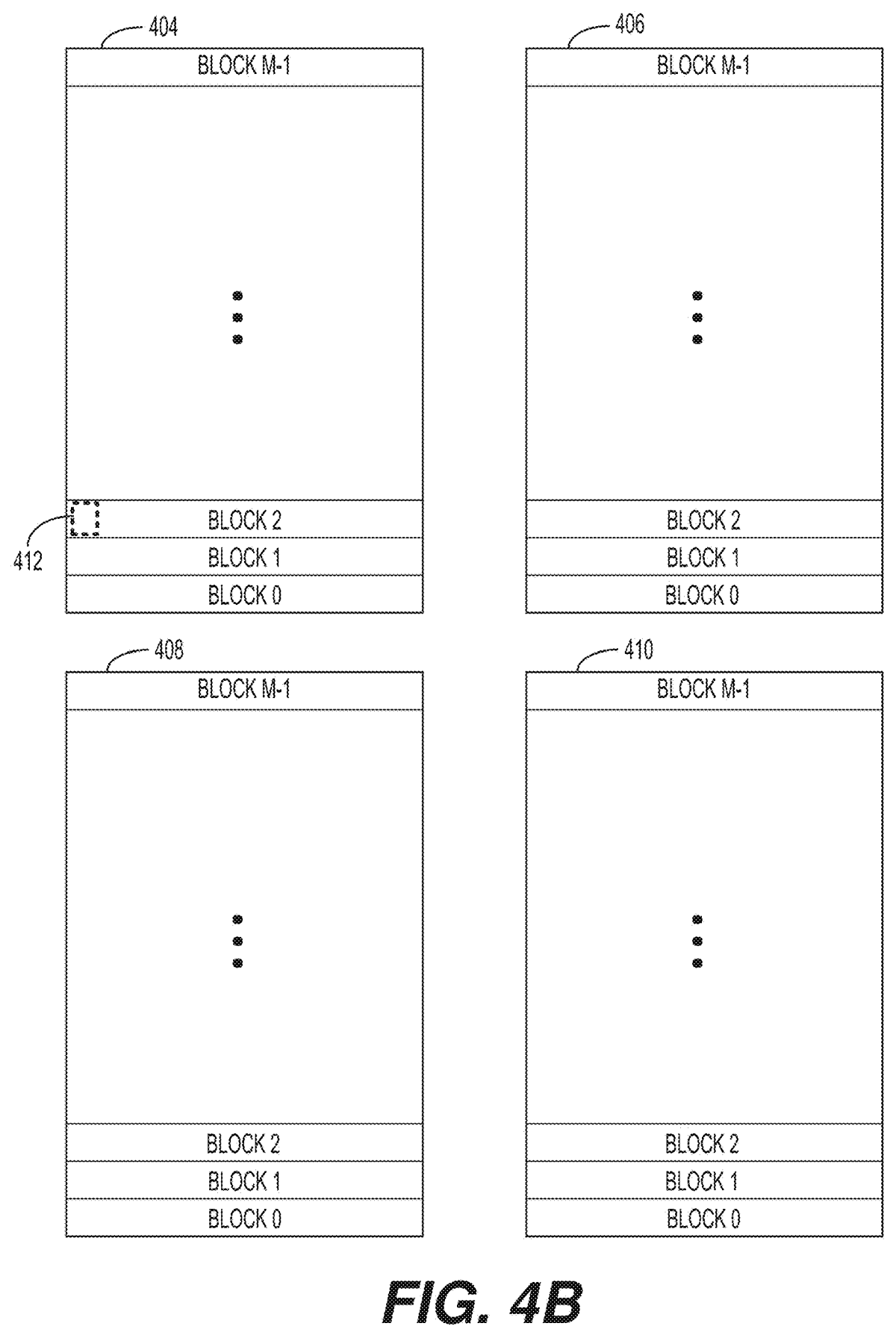

404
BLOCK M-1
BLOCK 2
412
BLOCK 1
BLOCK 0

406
BLOCK M-1
BLOCK 2
BLOCK 1
BLOCK 0

408
BLOCK M-1
BLOCK 2
BLOCK 1
BLOCK 0

410
BLOCK M-1
BLOCK 2
BLOCK 1
BLOCK 0

FIG. 4B

READ TECHNIQUES FOR NON-VOLATILE MEMORY

BACKGROUND

1. Field

The present disclosure is related generally to read techniques for non-volatile memory and, more particularly, to read techniques that offer improved performance.

2. Related Art

Semiconductor memory is widely used in various electronic devices such as cellular telephones, digital cameras, personal digital assistants, medical electronics, mobile computing devices, servers, solid state drives, non-mobile computing devices and other devices. Semiconductor memory may be non-volatile memory or volatile memory. A non-volatile memory allows information to be stored and retained even when the non-volatile memory is not connected to a source of power (e.g., a battery).

Non-volatile memory devices include one or more memory chips having multiple arrays of memory cells. The memory arrays may have associated decoders and circuits for performing read, write, and erase operations. Memory cells within the arrays may be arranged in horizontal rows and vertical columns. Each row may be addressed by a word line, and each column may be addressed by a bit line. Data may be loaded into columns of the array using a series of data busses. Each column may hold a predefined unit of data, for instance, a word encompassing two bytes of information.

In some applications, semiconductor memory is used to store very large amounts of data that are repeatedly accessed (e.g., read) very rapidly. For example, in some machine learning applications, large language models that include a terabyte (or more) of data must be stored in memory and retrieved at a very high data rate. Accordingly, such applications require very high bandwidth and low power.

Currently, high bandwidth volatile memory devices (e.g., DRAM memory devices called "high bandwidth memory" or "HBM") are used for such applications. Non-volatile memory (e.g., NAND) is significantly less expensive than DRAM, but the bandwidth of conventional NAND memory devices is too low, and the power consumption of conventional NAND memory devices is too high to provide a viable alternative to HBM devices. Therefore, there is a need to provide high bandwidth, low power non-volatile memory.

SUMMARY

An aspect of the present disclosure is related to a method of operating a memory device. The method includes the step of preparing a plurality of planes, each of the planes having a plurality of memory blocks. The method proceeds with the step of receiving a read command for a selected memory block of the plurality of planes. The method continues with the step of determining a count of planes of the plurality of planes that have memory blocks undergoing a block activation process. The block activation process includes ramping a plurality of word lines to a pass voltage. In response to the count being below or equal to a predetermined threshold, the method continues with the step of beginning the block activation process for the selected memory block. In response to the count being above the predetermined threshold, the method proceeds with the step of delaying the block activation process for the selected memory block until the number of planes that have memory blocks undergoing the block activation process is below the predetermined threshold.

According to another aspect of the present disclosure, following the block activation process, at least one sensing operation is performed on at least one word line of the plurality of word lines of the selected memory block prior to a block deactivation process.

According to yet another aspect of the present disclosure, the at least one sensing operation includes a plurality of sensing operations.

According to still another aspect of the present disclosure, the at least one sensing operation includes ramping a voltage applied to a selected word line from the pass voltage to a reference voltage.

According to a further aspect of the present disclosure, the block deactivation process includes ramping the plurality of word lines from the pass voltage to no more than two Volts.

According to yet a further aspect of the present disclosure, in each of the planes, the plurality of memory blocks share a common set of bit lines.

According to still a further aspect of the present disclosure, the predetermined threshold is greater than one.

Another aspect of the present disclosure is related to a memory device that includes a plurality of planes. Each of the planes has a plurality of memory blocks, and the memory blocks include arrays of memory cells that are arranged in a plurality of word lines. The memory device also includes circuitry that is configured to read data of the memory cells. The circuitry is configured to receive a read command for a selected memory block of the plurality of planes. The circuitry is also configured to determine a count of planes of the plurality of planes that have memory blocks undergoing a block activation process, which includes ramping the plurality of word lines to a pass voltage. In response to the count being below or equal to a predetermined threshold, the circuitry begins the block activation process for the selected memory block. In response to the count being above the predetermined threshold, the circuitry delays the block activation process for the selected memory block until the number of planes that have memory blocks undergoing the block activation process is below the predetermined threshold.

According to another aspect of the present disclosure, following the block activation process, the circuitry is configured to perform at least one sensing operation on at least one word line of the plurality of word lines of the selected memory block prior to a block deactivation process.

According to yet another aspect of the present disclosure, the at least one sensing operation includes a plurality of sensing operations.

According to still another aspect of the present disclosure, the at least one sensing operation includes ramping a voltage applied to a selected word line from the pass voltage to a reference voltage.

According to a further aspect of the present disclosure, the block deactivation process includes the circuitry ramping the plurality of word lines from the pass voltage to no more than two Volts.

According to yet a further aspect of the present disclosure, in each of the planes, the plurality of memory blocks share a common set of bit lines.

According to still a further aspect of the present disclosure, the predetermined threshold is greater than one.

Yet another aspect of the present disclosure is related to a computing system that includes at least one non-volatile memory device with a plurality of planes. Each of the planes has a plurality of memory blocks, and the memory blocks include arrays of memory cells that are arranged in a plurality of word lines. The computing system also includes circuitry that is configured to read data of the memory cells. The circuitry is configured to receive a read command for a selected memory block of the plurality of planes and determine a count of planes of the plurality of planes that have memory blocks undergoing a block activation process. The block activation process including ramping the plurality of word lines to a pass voltage. In response to the count being below or equal to a predetermined threshold, the circuitry is configured to begin the block activation process for the selected memory block. In response to the count being above the predetermined threshold, the circuitry is configured to delay the block activation process for the selected memory block until the number of planes that have memory blocks undergoing the block activation process is below the predetermined threshold.

According to another aspect of the present disclosure, following the block activation process, the circuitry is configured to perform at least one sensing operation on at least one word line of the plurality of word lines of the selected memory block prior to a block deactivation process.

According to yet another aspect of the present disclosure, the at least one sensing operation includes a plurality of sensing operations.

According to still another aspect of the present disclosure, the at least one sensing operation includes ramping a voltage applied to a selected word line from the pass voltage to a reference voltage.

According to a further aspect of the present disclosure, the block deactivation process includes the circuitry ramping the plurality of word lines from the pass voltage to no more than two Volts.

According to yet a further aspect of the present disclosure, in each of the planes, the plurality of memory blocks share a common set of bit lines.

BRIEF DESCRIPTION OF THE DRAWINGS

These and other features and advantages of the subject disclosure will become more readily appreciated when considered in connection with the following description of the presently preferred embodiments, appended claims and accompanying drawings, in which:

FIG. 4B is a block diagram of one embodiment of a memory structure having four planes;

DETAILED DESCRIPTION OF THE ENABLING EMBODIMENT

According to an aspect of the present disclosure, power management read techniques are provided for non-volatile memory. These techniques involve separating a read command into three parts or phases: a block activation phase, a page selection phase, and a block deactivation phase. By limiting the number of parallel block activation phases but not the number of parallel page selection phases, both a low peak power consumption and very high bandwidth can be achieved. These techniques are discussed in further detail below.

Figure 1:
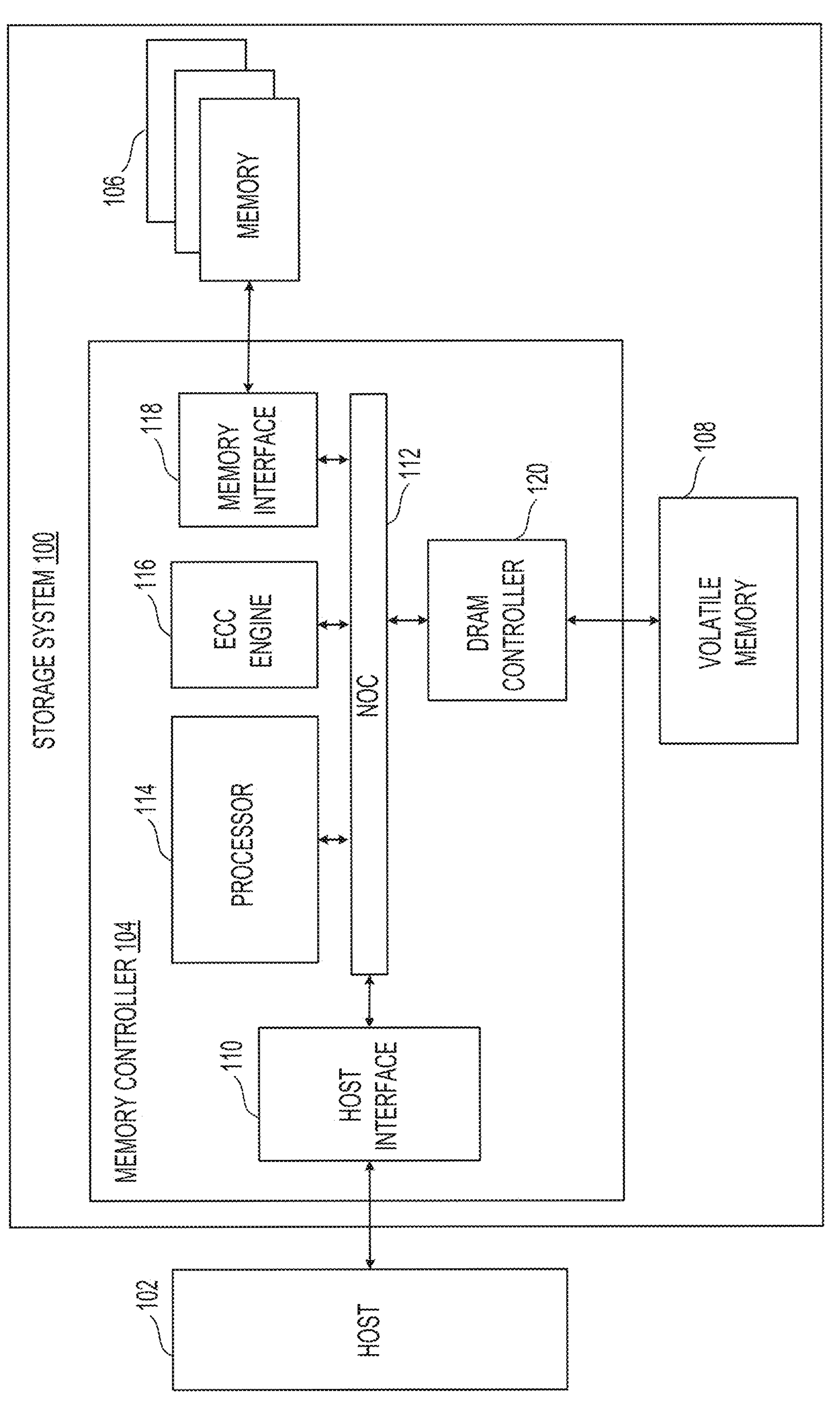
FIG. 1 is a block diagram depicting one embodiment of a storage system.

FIG. 1 is a block diagram of one embodiment of a storage system 100 that implements the proposed technology described herein. In one embodiment, the storage system 100 is a solid state drive ("SSD"). The storage system 100 also can be a memory card, a USB drive, or any other type of storage system. In other words, the proposed technology is not limited to any one type of memory system.

The storage system 100 is connected to a host 102, which can be a computer; server; electronic device (e.g., smart phone, tablet or other mobile device); appliance; or another apparatus that uses memory and has data processing capabilities. In some embodiments, the host 102 is separate from, but connected to, the storage system 100. In other embodiments, the storage system 100 is embedded within the host 102.

The components of the storage system 100 depicted in FIG. 1 are electrical circuits. The storage system 100 includes a memory controller 104 connected to non-volatile memory 106 and local high speed volatile memory 108 (e.g., DRAM). A local high speed volatile memory 108 is used by memory controller 104 to perform certain functions. For example, the local high speed volatile memory 108 stores logical to physical address translation tables ("L2P tables").

The memory controller 104 includes a host interface 110 that is connected to and in communication with the host 102. In one embodiment, a host interface 110 implements an NVM Express (NVMe) over PCI Express (PCIe). Other interfaces can also be used, such as SCSI, SATA, etc. The host interface 110 also is connected to a network-on-chip (NOC) 112.

An NOC is a communication subsystem on an integrated circuit. The NOC's can span synchronous and asynchronous clock domains or use un-clocked asynchronous logic. NOC technology applies networking theory and methods to on-chip communications and brings notable improvements over conventional bus and crossbar interconnections. The NOC improves the scalability of systems on a chip (SoC) and the power efficiency of complex SoCs compared to other designs.

The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, the NOC 112 can be replaced by a bus.

Connected to and in communication with NOC 112 is a processor 114, an ECC engine 116, a memory interface 118, and a DRAM controller 120. The DRAM controller 120 is used to operate and communicate with local high speed volatile memory 108 (e.g., DRAM). In other embodiments, the local high speed volatile memory 108 can be SRAM or another type of volatile memory.

In operation, the processor 114 performs the various controller memory operations, such as programming, erasing, reading, and memory management processes. In one embodiment, the processor 114 is programmed by firmware. In other embodiments, the processor 114 is a custom and dedicated hardware circuit without any software. The processor 114 also implements a translation module, as a software/firmware process or as a dedicated hardware circuit.

In many systems, the non-volatile memory is addressed internally to the storage system using physical addresses associated with one or more memory dies. However, the host system will use logical addresses to address the various memory locations. This enables the host to assign data to consecutive logical addresses, while the storage system is free to store the data as it wishes among the locations of the one or more memory dies. To implement this system, the memory controller 104 (e.g., the translation module) performs address translation between the logical addresses used by the host and the physical addresses used by the memory dies.

One example implementation is to maintain tables (i.e., the L2P tables referenced above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 108 cannot hold all of the L2P tables. In such a case, the entire set of L2P tables are stored in non-volatile memory 106 and a subset of the L2P tables are cached (L2P cache) in the local high speed volatile memory 108.

The ECC engine 116 performs error correction services. For example, the ECC engine 116 performs data encoding and decoding, as per an implemented ECC technique. In one embodiment, the ECC engine 116 is an electrical circuit programmed by software. For example, the ECC engine 116 can be a processor that can be programmed. In other embodiments, the ECC engine 116 is a custom and dedicated hardware circuit without any software. In another embodiment, the function of ECC engine 116 is implemented by the processor 114. During a sensing operation (read or verify), the ECC engine 116 can identify and correct failed bits up to a threshold. If the number of failed bits in a selected word line is above the threshold, then the ECC engine 116 is not able to correct the failed bits on its own, but it is able to identify which memory cells contain failed bits.

The memory interface 118 communicates with the non-volatile memory 106. In one embodiment, the memory interface provides a Toggle Mode interface. However, other interfaces also can be used. In some example implementations, the memory interface 118 (or another portion of the controller 104) implements a scheduler and buffer for transmitting data to and receiving data from one or more memory die.

Figure 2A:
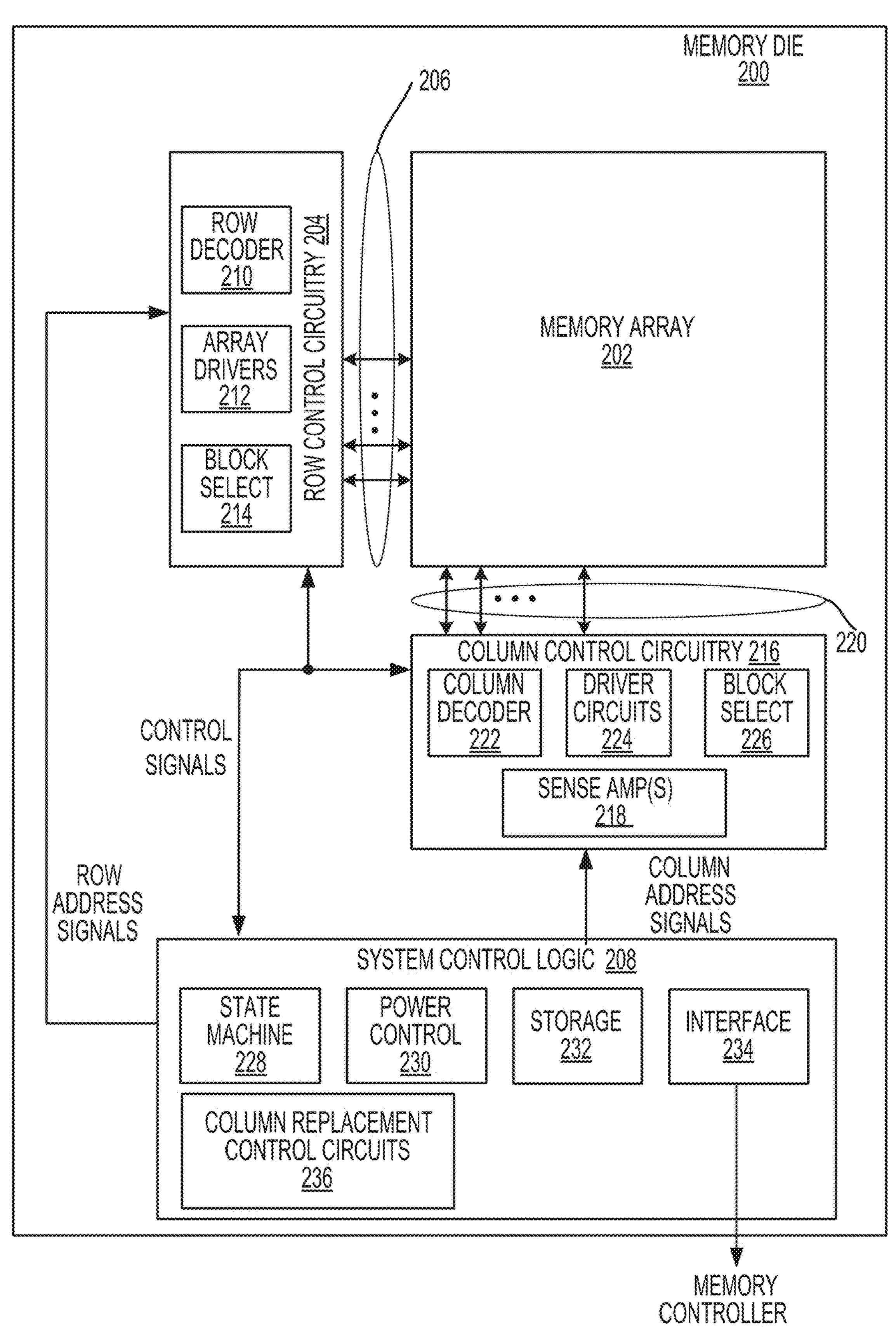
FIG. 2A is a block diagram of one embodiment of a memory die.

In one embodiment, the non-volatile memory 106 includes one or more memory die. FIG. 2A is a functional block diagrams of one embodiment of a memory die 200 that includes the non-volatile memory 106. Each of the one or more memory dies of non-volatile memory 106 can be implemented as the memory die 200 of FIG. 2A. The components depicted in FIG. 2A are electrical circuits.

The memory die 200 includes a memory array 202 that can include non-volatile memory cells, as described in further detail below. The memory array 202 includes a plurality of layers of word lines that are organized as rows, and a plurality of layers of bit lines that are organized as columns. However, other orientations can also be implemented.

The memory die 200 also includes row control circuitry 204, whose outputs 206 are connected to respective word lines of the memory array 202. In operation, the row control circuitry 204 receives a group of M row address signals and one or more various control signals from a system control logic circuit 208 and may include such circuits as row decoders 210, array terminal drivers 212, and block select circuitry 214 for both reading and writing (programming) operations.

The row control circuitry 204 also may include read/write circuitry. The memory die 200 also includes column control circuitry 216 including sense amplifier(s) 218 whose input/outputs 220 are connected to respective bit lines of the memory array 202. Although only a single block is shown for memory array 202, the memory die 200 can include multiple arrays that can be individually accessed.

The column control circuitry 216 receives a group of N column address signals and one or more various control signals from system control logic 208. The column control circuitry 216 may also include such circuits as column decoders 222; array terminal receivers or driver circuits 224; block select circuitry 226; read/write circuitry; and I/O multiplexers.

The system control logic 208 receives data and commands from memory controller 104 (FIG. 1) and provides output data and status to host 102. In some embodiments, the system control logic 208, which includes one or more electrical circuits, includes a state machine 228 that provides die-level control of memory operations. In one embodiment, the state machine 228 is programmable by software. In other embodiments, the state machine 228 does not use software and is completely implemented in hardware (e.g., electrical circuits). In another embodiment, the state machine 228 is replaced by a micro-controller or microprocessor, either on or off the memory chip.

The system control logic 208 also can include a power control module 230 that controls the power and voltages supplied to the rows and columns of memory structure 202 during memory operations and may include charge pumps and regulator circuits for creating regulating voltages. The system control logic 208 also includes storage 232 (e.g., RAM, registers, latches, etc.), which may be used to store parameters for operating memory array 202.

In operation, commands and data are transferred between the memory controller 104 and the memory die 200 via a memory controller interface 234 (also referred to as a "communication interface"). The memory controller interface 234 is an electrical interface for communicating with memory controller 104. Examples of the memory controller interface 234 include a Toggle Mode Interface and an Open NAND Flash Interface (ONFI). Other I/O interfaces can also be used in other embodiments.

In an embodiment, the system control logic 208 also includes column replacement control circuits 236, described in more detail below.

In some embodiments, all elements of the memory die 200, including the system control logic 208, can be formed as part of a single die. In other embodiments, some or all of the system control logic 208 can be formed on a different die.

In one embodiment, the memory structure 202 comprises a three-dimensional memory array of non-volatile memory cells in which multiple memory levels are formed above a single substrate, such as a wafer. The memory structure 202 may include any type of non-volatile memory that are monolithically formed in one or more physical levels of memory cells having an active area disposed above a silicon (or other type of) substrate. In one example, the non-volatile memory cells include charge-trapping layers and are arranged in a plurality of vertical NAND strings.

In another embodiment, the memory structure 202 includes a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. For example, suitable technologies for the memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of memory structure 202 include two dimensional arrays, three dimensional arrays, cross-point arrays, stacked two dimensional arrays, vertical bit line arrays, and the like. One example of a ReRAM cross-point memory includes reversible resistance-switching elements arranged in cross-point arrays accessed by X lines and Y lines (e.g., word lines and bit lines).

In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, and the ferromagnetic layers are separated by a thin insulating layer. One of the two ferromagnetic layers is a permanent magnet that is set to a particular polarity, and the other ferromagnetic layer's magnetization can be changed to match that of an external field to store memory. The memory array may be built from a grid of such memory cells. In one embodiment, for programming, each memory cell lies between a pair of write lines that are arranged at right angles to each other, parallel to the cell, one above and one below the cell. When current is passed through the write lines, an induced magnetic field is created. MRAM based memory embodiments will be discussed in more detail below.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

The technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) the memory array or structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202. However, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to system control logic 208, reduced availability of area can limit the available functions that can be implemented on-chip. Consequently, a basic trade-off in the design of a memory die for the storage system 100 may be the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based.

Elements such as the sense amplifier circuits, charge pumps, logic elements in a state machine, and other peripheral circuitry in the system control logic 208 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto a separately formed die that is then bonded together with another die. More specifically, the memory structure 202 can be formed on one die (referred to as the memory die) and some or all of the peripheral circuitry elements, including one or more control circuits, can be formed on a separate die (referred to as the control die). A memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology.

For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array.

The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
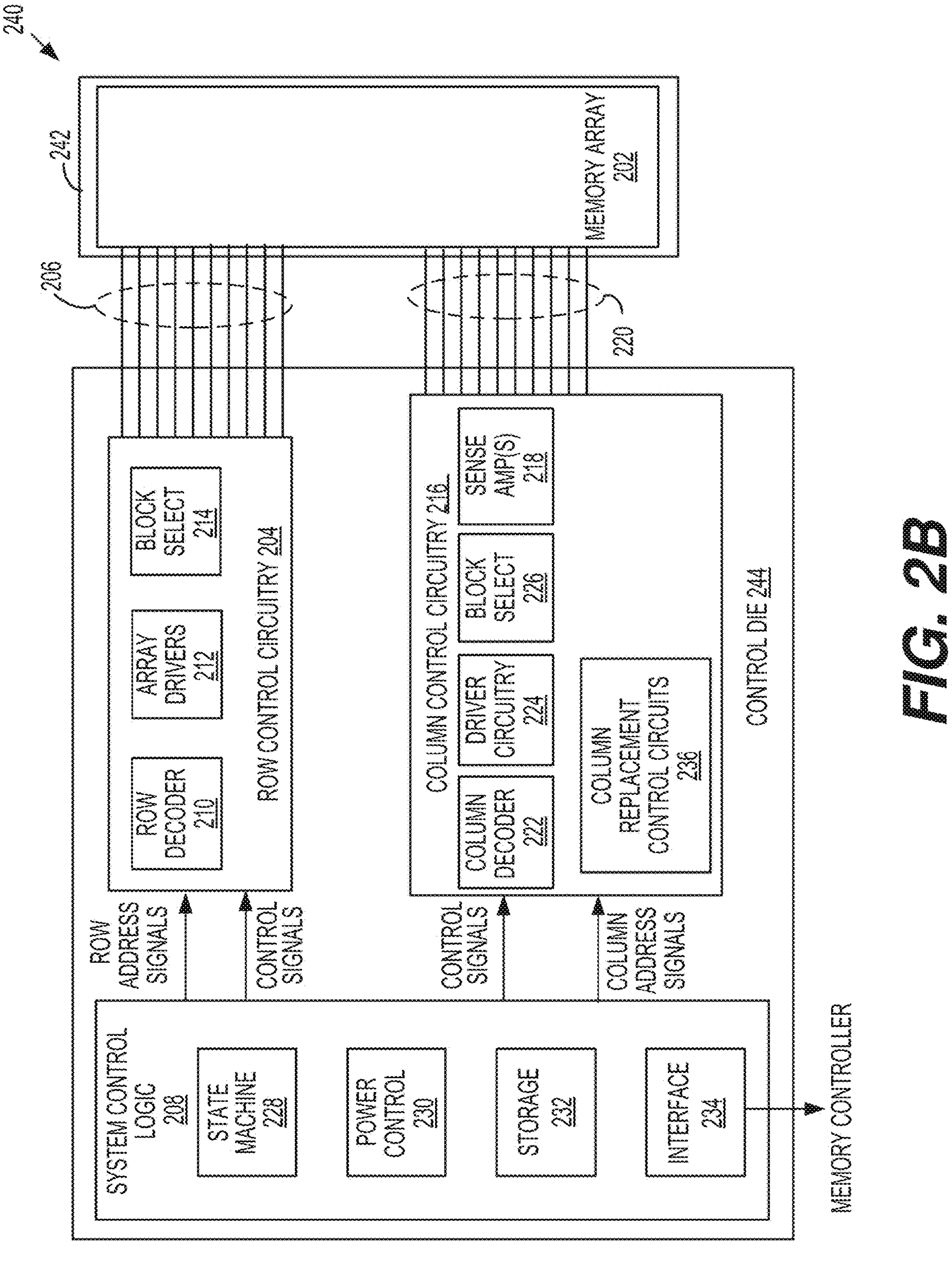
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 240. One or more integrated memory assemblies 240 may be used to implement the non-volatile memory 106 of storage system 100.

The integrated memory assembly 240 includes two types of semiconductor die (or more succinctly, "die"). The memory die 242 includes the memory structure 202 with the non-volatile memory cells. A control die 244 includes control circuitry 208, 216, and 204 (as described above). In some embodiments, the control die 244 is configured to connect to the memory structure 202 in the memory die 242. In some embodiments, the memory die 242 and control die 244 are bonded together.

FIG. 2B shows an example of the peripheral circuitry, including control circuits, formed in a peripheral circuit or control die 244 coupled to memory structure 202 formed in memory die 242. Common components are labelled similarly to FIG. 2A. The system control logic 208, the row control circuitry 204, and the column control circuitry 216 are located in the control die 244. In some embodiments, all or a portion of column control circuitry 216 and all or a portion of the row control circuitry 204 are located on memory die 242. In some embodiments, some of the circuitry in the system control logic 208 is located on the memory die 242.

The system control logic 208, the row control circuitry 204, and the column control circuitry 216 may be formed by a common process (e.g., CMOS process), so that adding elements and functions, such as the ECC engine or controller, more typically found on a memory controller 104 may require few or no additional process steps, i.e., the same process steps used to fabricate controller 104 may also be used to fabricate the system control logic 208, the row control circuitry 204, and the column control circuitry 216. Thus, while moving such circuits from a die such as the memory die 242 may reduce the number of steps needed to fabricate such a die, adding such circuits to a die such as control die 244 may not require many additional process steps. The control die 244 also could be referred to as a CMOS die, due to the use of CMOS technology to implement some or all of the control circuitry 204, 208, 216.

FIG. 2B shows column control circuitry 216, including the sense amplifier(s) 218, on control die 244 coupled to memory structure 202 on memory die 242 through electrical paths 220. The electrical paths 220 may provide an electrical connection between the column decoder 222, the driver circuitry 224, the block select 226, and the bit lines of the memory structure 202. In an embodiment, the column control circuitry 216 also includes column replacement control circuits 236, which are described in more detail below.

Electrical paths may extend from the column control circuitry 216 in the control die 244 through pads on the control die 244 that are bonded to corresponding pads of the memory die 242, which are connected to the bit lines of the memory structure 202. Each bit line of the memory structure 202 may have a corresponding one of the electrical paths 220, including a pair of bond pads, which connects to the column control circuitry 216.

Similarly, the row control circuitry 204, including the row decoder 210, the array drivers 212, and the block select 214 are coupled to the memory structure 202 through electrical paths 206. Each of the electrical paths 206 may correspond to a data containing word line, a dummy word line, or a select gate line. Additional electrical paths may also be provided between control die 244 and memory die 242.

For purposes of this document, the phrases "a control circuit," "control circuitry," "circuitry," or "one or more control circuits" can include any one of or any combination of the memory controller 104; the state machine 228; all or a portion of the system control logic 208; all or a portion of row control circuitry 204; all or a portion of column control circuitry 216; a microcontroller; a microprocessor; and/or other similar functioned circuits.

The control circuit can include hardware only or a combination of hardware and software (including firmware). For example, one or more controllers programmed by firmware to perform the functions described herein is one example of a control circuit. A control circuit can include a processor, FGA, ASIC, integrated circuit, or other type of circuit.

In some embodiments, there is more than one control die 244 and more than one memory die 242 in an integrated memory assembly 240. In some embodiments, the integrated memory assembly 240 includes a stack of multiple control dies 244 and multiple memory dies 242.

Figure 3A:
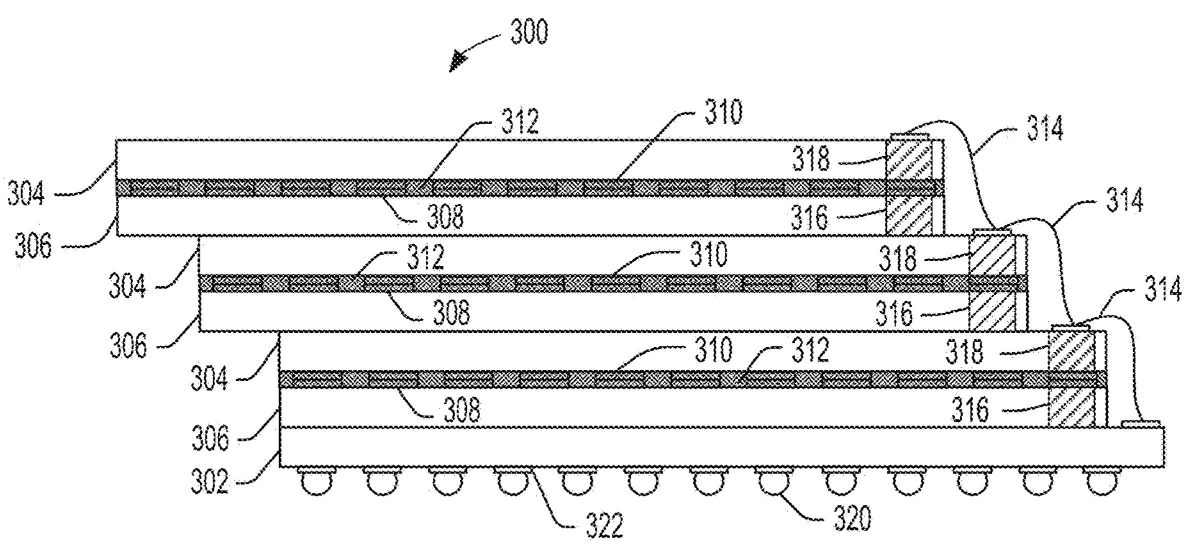
FIGS. 3A and 3B depict different embodiments of integrated memory assemblies.

FIG. 3A depicts a side view of an embodiment of an integrated memory assembly 300 stacked on a substrate 302 (e.g., a stack including control die 304 and memory die 306). In this embodiment, the integrated memory assembly 300 has three control die 304 and three memory die 306. In some embodiments, there are more than three memory die 306 and more than three control die 304.

Each control die 304 is affixed (e.g., bonded) to at least one memory die 306. Some of the bond pads 308/310 are depicted, although there may be many more bond pads. A space between two die 306, 304 that are bonded together is filled with a solid layer 312, which may be formed from epoxy or other resin or polymer. This solid layer 312 protects the electrical connections between the die 306, 304 and further secures the die together. Various materials may be used as solid layer 312, but in some embodiments, it may be Hysol epoxy resin from Henkel Corp., having offices in California, USA.

Integrated memory assembly 300 may for example be stacked with a stepped offset, leaving the bond pads at each level uncovered and accessible from above. Wire bonds 314 connected to the bond pads connect control die 304 to substrate 302. A number of such wire bonds may be formed across the width of each control die 304 (i.e., into the page of FIG. 3A).

A memory die through silicon via (TSV) 316 may be used to route signals through each memory die 306. A control die TSV 318 may be used to route signals through each control die 304. The TSVs 316, 318 may be formed before, during or after formation of the integrated circuits in semiconductor die 306, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, Solder balls 320 optionally may be affixed to contact pads 322 on a lower surface of substrate 302. Solder balls 320 may be used to couple integrated memory assembly 300 electrically and mechanically to a host device such as a printed circuit board. Solder balls 320 may be omitted where the integrated memory assembly 300 is to be used as an LGA package. Solder balls 320 may form a part of an interface between integrated memory assembly 300 and memory controller 104 (FIG. 1).

Figure 3B:
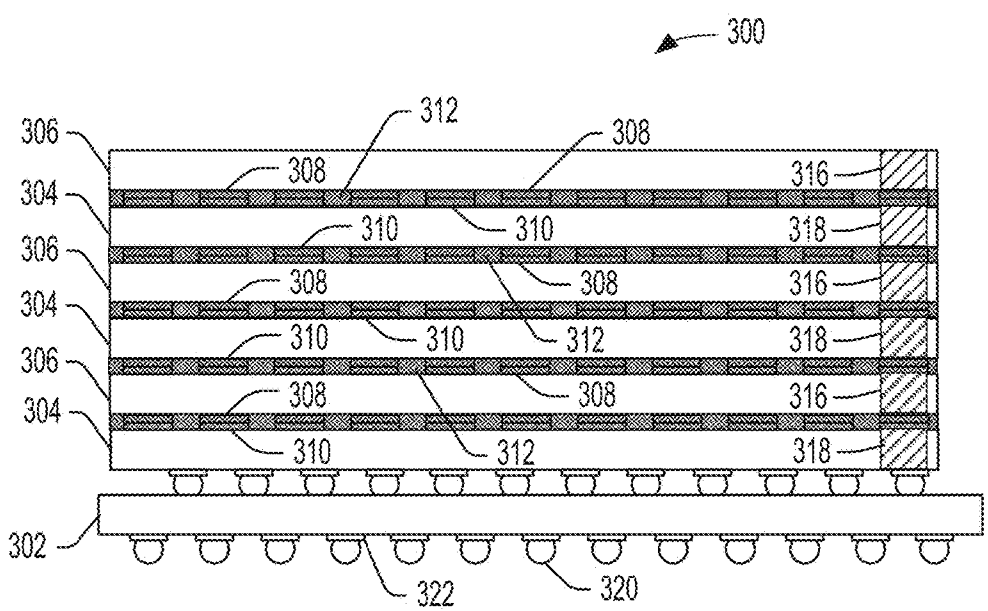

FIG. 3B depicts a side view of another embodiment of an integrated memory assembly 300 stacked on a substrate 302. The integrated memory assembly 300 of FIG. 3B has three control die 304 and three memory die 306. In some embodiments, there are many more than three memory die 306 and many more than three control die 304. In this example, each control die 304 is bonded to at least one memory die 306. Optionally, a control die 304 may be bonded to two or more memory die 306.

Some of the bond pads 308, 310 are depicted, but there may be many more bond pads than are illustrated. A space between two die 306, 304 that are bonded together is filled with a solid layer 312, which may be formed from epoxy or other resin or polymer. In contrast to the example in FIG. 3A, the integrated memory assembly 300 of FIG. 3B does not have a stepped offset. A memory die TSV 316 may be used to route signals through each memory die 306. A control die TSV 318 may be used to route signals through each control die 304.

As has been briefly discussed above, control die 304 and memory die 306 may be bonded together. Bond pads on each control die 304 and each memory die 306 may be used to bond the two die together. In some embodiments, the bond pads are bonded directly to each other, without solder or other added material, in a so-called Cu-to-Cu bonding process.

In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension.

As has been briefly discussed above, the control die 304 and the memory die 306 may be bonded together. Bond pads on each control die 304 and each memory die 306 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat also may be applied. In embodiments using cu-to-cu bonding, the bond pads may be about 5 μm square and spaced from each other with a pitch of 5 μm to 5 μm. Although this process is referred to herein as cu-to-cu bonding, this term also may apply even where the bond pads are formed of materials other than copper. When the area of bond pads is small, it may be difficult to bond the semiconductor die together. The size of and pitch between bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on a surface of the control die 304 and the memory die 306. Where no such film is initially provided, a space between the die may be under filled with an epoxy or other resin or polymer. The under-fill material may be applied as a liquid which then hardens into a solid layer. This under-fill step protects the electrical connections between control die 304 and memory die 306, and further secures the die together. Various materials may be used as under-fill material, such as Hysol epoxy resin from Henkel Corp., having offices in California, U.S.A.

Figure 4A:
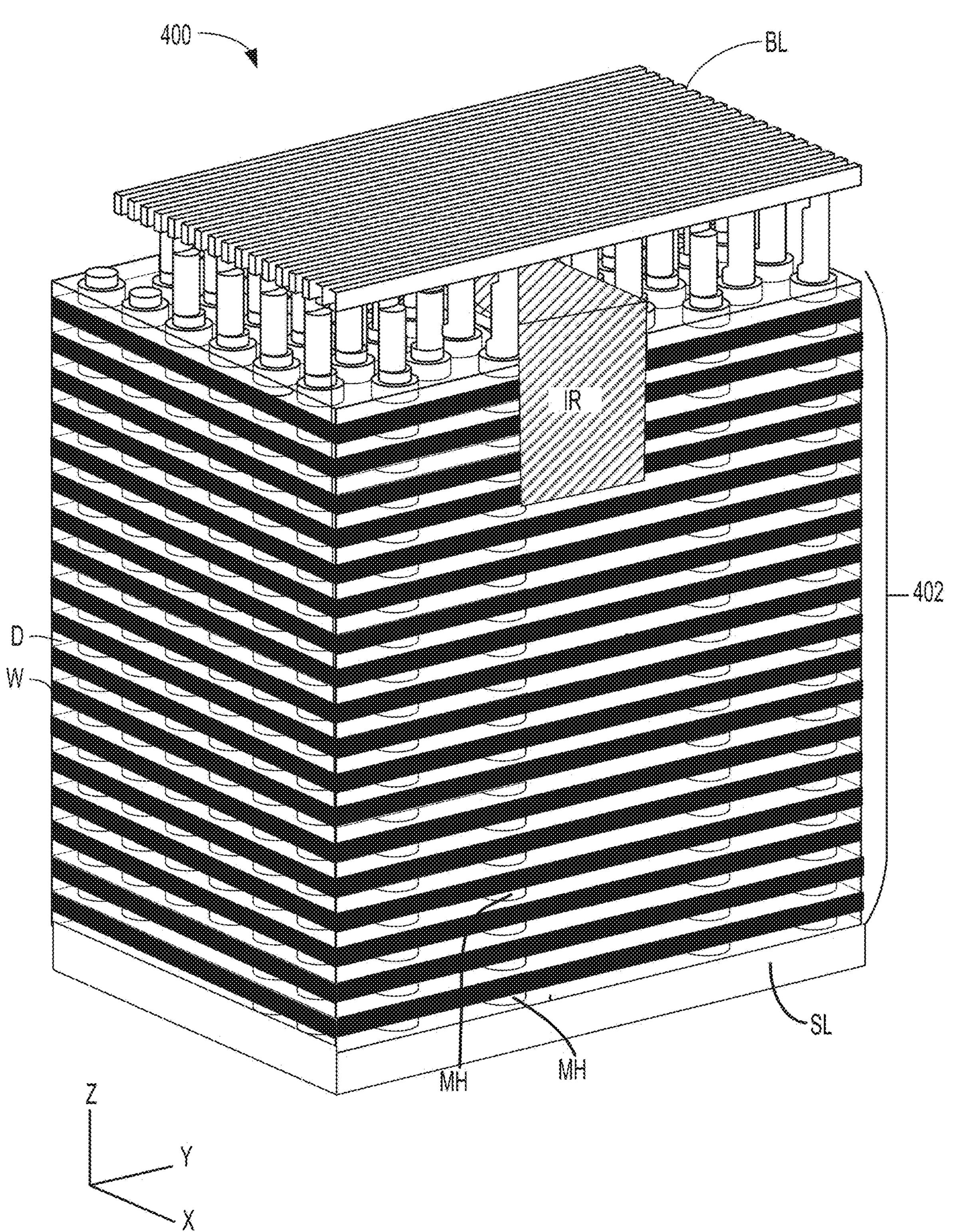
FIG. 4A is a perspective view of a portion of one embodiment of a monolithic three dimensional memory structure.

FIG. 4A is a perspective view of a portion of one example embodiment of a monolithic three dimensional memory array/structure included in memory structure 202, which includes a plurality non-volatile memory cells arranged as vertical NAND strings. For example, FIG. 4A shows a portion 400 of one block of memory. The structure depicted includes a set of bit lines BL positioned above a stack 402 of alternating dielectric (insulating) layers and conductive layers. For example purposes, one of the dielectric layers is marked as D and one of the conductive layers (also called word line layers) is marked as W. The number of alternating dielectric layers and conductive layers can vary based on specific implementation requirements.

As will be explained below, in one embodiment the alternating dielectric layers and conductive layers are divided into, for example, four or five (or a different number of) regions by isolation regions IR. FIG. 4A shows one isolation region IR separating two regions. Below the alternating dielectric layers and word line layers is a common source line layer SL. Memory holes are formed in the stack of alternating dielectric layers and conductive layers. For example, one of the memory holes is marked as MH. Note that in FIG. 4A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells.

The non-volatile memory cells are arranged in memory holes, and each memory cell can store one or more bits of data, e.g., up to five bits of data per memory cell. More details of the three dimensional monolithic memory array that comprises memory structure 202 is provided below.

FIG. 4B is a block diagram explaining one example organization of memory structure 202, which is divided into four planes 404, 406, 408 and 410. Each plane is then divided into M blocks. In one example, each plane has about 2,000 blocks ("Block 0" to "Block M-1" with M being 2,000). However, different numbers of blocks and planes can also be used.

In one embodiment, a block of memory cells is a unit of erase. That is, all memory cells of a block are erased together. In other embodiments, the blocks can be divided into sub-blocks, each of which includes a plurality of word lines, and the sub-blocks can be the unit of erase. Memory cells also can be grouped into blocks for other reasons, such as to organize the memory structure to enable the signaling and selection circuits.

In some embodiments, a block represents groups of connected memory cells as the memory cells of a block share a common set of word lines. For example, the word lines for a block are all connected to all of the vertical NAND strings for that respective block. Although FIG. 4B shows four planes, each of which includes a plurality of blocks, more or fewer than four planes can be implemented in the memory structure 202. In some embodiments, the memory structure includes eight planes.

Each block typically is divided into one or more pages, with each page being a unit of programming/writing and a unit of reading. Other units of programming also can be used. In an embodiment, one or more pages of data are typically stored in one row of memory cells. For example, one or more pages of data may be stored in memory cells connected to a common word line. In an embodiment, a page includes data stored in all memory cells connected to a common word line within the block.

Figure 4C:
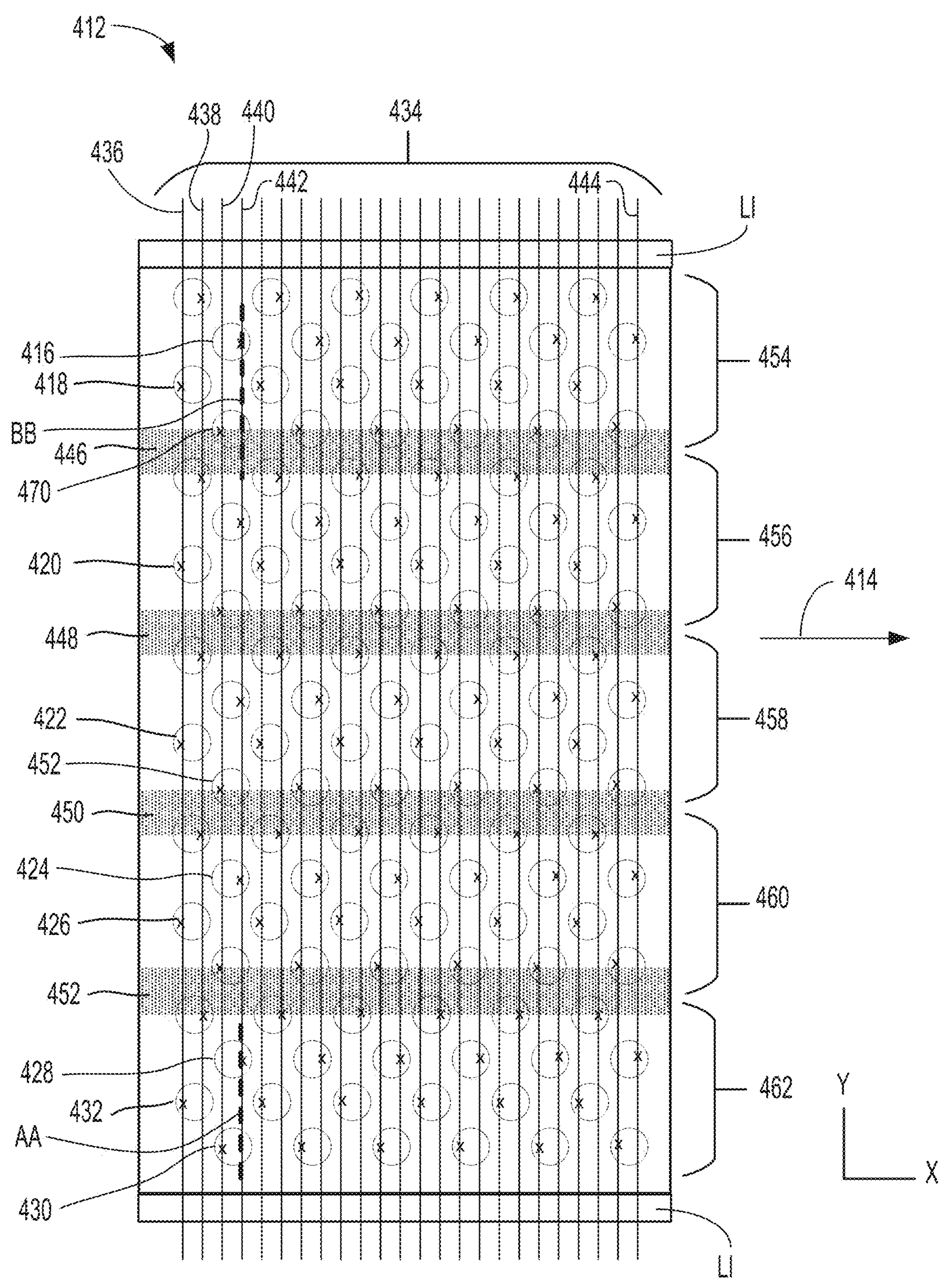
FIG. 4C depicts a top view of a portion of one embodiment of a block of memory cells.

FIGS. 4C-4G depict an example three dimensional ("3D") NAND structure that corresponds to the structure of FIG. 4A and can be used to implement the memory structure 202 of FIGS. 2A and 2B. FIG. 4C is a block diagram that depicts a top view of a portion 412 of Block 2 of plane 404. As can be seen from FIG. 4C, the block depicted in FIG. 4C extends in the direction of 414. In one embodiment, the memory array has many such layers with only the top layer being illustrated in FIG. 4C.

FIG. 4C depicts a plurality of circles that represent the memory holes, which are also referred to as vertical columns. Each of the memory holes/vertical columns includes multiple select transistors (also referred to as a select gate or selection gate) and multiple memory cells. In one embodiment, each memory hole/vertical column implements a NAND string. For example, FIG. 4C labels a subset of the memory holes/vertical columns/NAND strings 416, 418, 420, 422, 424, 426, 428, 430, and 432.

FIG. 4C also depicts a set of bit lines 434, including bit lines 436, 438, 440, 442, . . . 444. FIG. 4C shows twenty four bit lines because only a portion of the block is depicted. It is contemplated that more than twenty four bit lines connected to memory holes/vertical columns of the block. Each of the circles representing memory holes/vertical columns has an "x" to indicate its connection to one of the bit lines. For example, bit line 436 is connected to the memory holes/vertical columns 418, 420, 422, 426, and 432. The bit lines 436, 438, 440, 442 also are in electrical communication with all other blocks in a given plane. In other words, each plane includes a plurality of memory blocks that share the same set of bit lines. Thus, in a given plane, only a single memory block can be operated on at a time.

The block depicted in FIG. 4C includes a set of isolation regions 446, 448, 450 and 452, which are formed of $SiO_2$. However, other dielectric materials also can be used. Isolation regions 446, 448, 450, and 452 serve to divide the top layers of the block into five regions. For example, the top layer depicted in FIG. 4C is divided into regions 454, 456, 458, 460, and 462.

In one embodiment, the isolation regions only divide the layers used to implement select gates so that NAND strings in different regions can be independently selected. In one example implementation, a bit line connects to one memory hole/vertical column/NAND string in each of regions 454, 456, 458, 460, and 462. In that implementation, each block has twenty-four rows of active columns and each bit line connects to five rows in each block.

In one embodiment, all of the five memory holes/vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4C also shows Line Interconnects LI, which are metal connections to the source line SL from above the memory array. Line Interconnects LI are positioned adjacent regions 454 and 462.

Although FIG. 4C shows each region 454, 456, 458, 460, and 462 as having four rows of memory holes/vertical columns, five regions and twenty-four rows of memory holes/vertical columns in a block, those exact numbers are an example implementation. Other embodiments may include more or fewer regions per block; more or fewer rows of memory holes/vertical columns per region; and more or fewer rows of vertical columns per block.

FIG. 4C also shows the memory holes/vertical columns being staggered. In other embodiments, different patterns of staggering can be used. In some embodiments, the memory holes/vertical columns are not staggered.

Figure 4D:
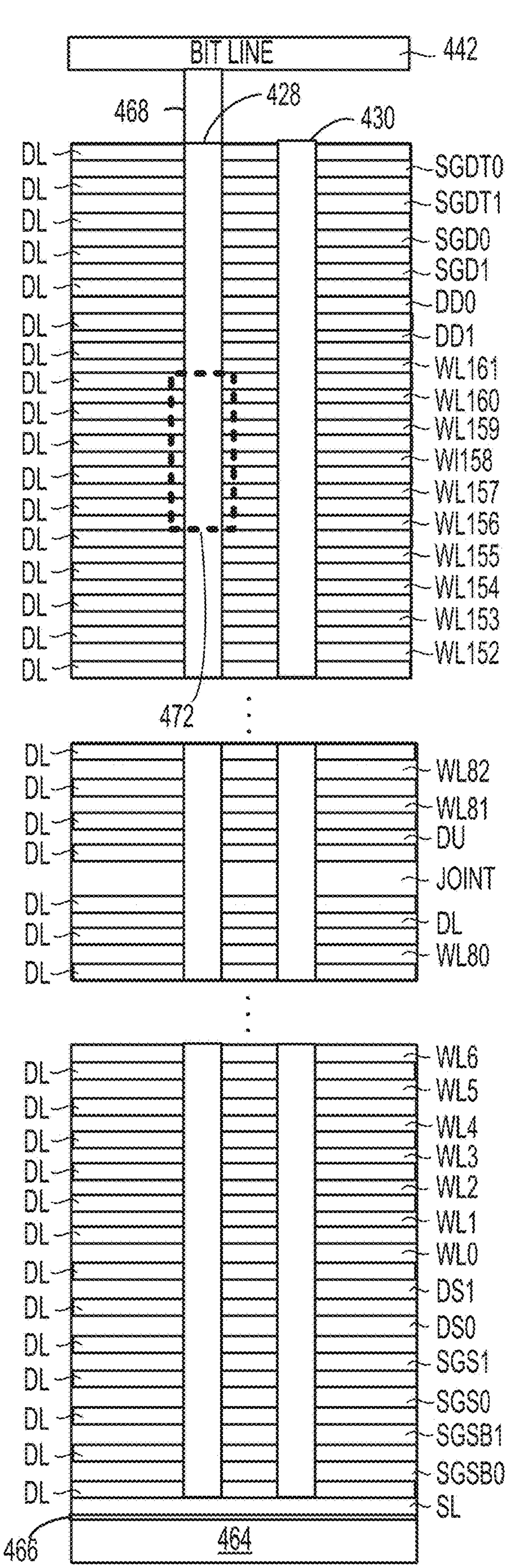
FIG. 4D depicts a cross sectional view of a portion of one embodiment of a block of memory cells.
Figure 4D:
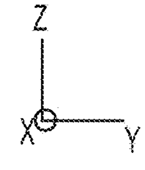

FIG. 4D depicts a portion of one embodiment of a three dimensional memory structure 202 showing a cross-sectional view along line AA of FIG. 4C. This cross sectional view cuts through memory holes/vertical columns (NAND strings) 428 and 430 of region 462 (see FIG. 4C).

The structure of FIG. 4D includes two drain side select layers SGD0 and SGD1; two source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL that are separated by a joint; one hundred and sixty two word line layers WL0-WL161 for connecting to data memory cells; and dielectric layers DL. Other embodiments can implement more or fewer than the numbers described above for FIG. 4D. In one embodiment, SGD0 and SGD1 are connected together and SGS0 and SGS1 are connected together. In other embodiments, more or fewer SGDs (greater or lesser than two) are connected together and more or fewer SGS devices (greater or lesser than two) are connected together.

In one embodiment, erasing the memory cells is performed using gate induced drain leakage (GIDL), which includes generating charge carriers at the GIDL generation transistors such that the carriers get injected into the charge trapping layers of the NAND strings to change (reduce) respective threshold voltages Vt of the memory cells. In the embodiment of FIG. 4D, there are two GIDL generation transistors at each end of the NAND string; however, in other embodiments there are more or fewer than two GIDL generation transistors.

Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

The GIDL generation transistors have an abrupt PN junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

The memory holes/vertical columns 428, 430 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 464, an insulating film 466 on the substrate, and source line SL. The NAND string of memory hole/vertical column 428 has a source end at a bottom of the stack and a drain end at a top of the stack. As in agreement with FIG. 4C, FIG. 4D show vertical memory hole/column 428 connected to bit line 442 via connector 468.

For ease of reference, drain side select layers, source side select layers, dummy word line layers, GIDL generation transistor layers and data word line layers collectively are referred to as conductive layers.

In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof.

In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-W161 connect to memory cells (also called data memory cells). The dummy word line layers connect to a plurality of dummy memory cells, which do not store data. In some embodiments, the data memory cells and the dummy memory cells may have a same structure. The drain side select layers SGD0 and SGD1 are used to electrically connect and disconnect the NAND strings to and from the bit lines. The source side select layers SGS0 and SGS1 are used to electrically connect and disconnect the NAND strings to and from the source line SL.

FIG. 4D shows that the memory array is implemented as a two tier architecture, with the tiers separated by a joint area. In one embodiment, it is expensive and/or challenging to etch so many word line layers intermixed with dielectric layers. To ease this burden, a first stack of word line layers (e.g., WL0-WL80) are laid down with alternating dielectric layers, then the Joint area is laid down, and next, a second stack of word line layers (e.g., WL81-WL161) are laid down with alternating dielectric layers. The joint area is thus positioned between the first stack of word line layers and the second stack of word line layers. In one embodiment, the joint areas are made from the same materials as the word line layers. In other embodiments, there can no joint area or there can be multiple joint areas.

Figure 4E:
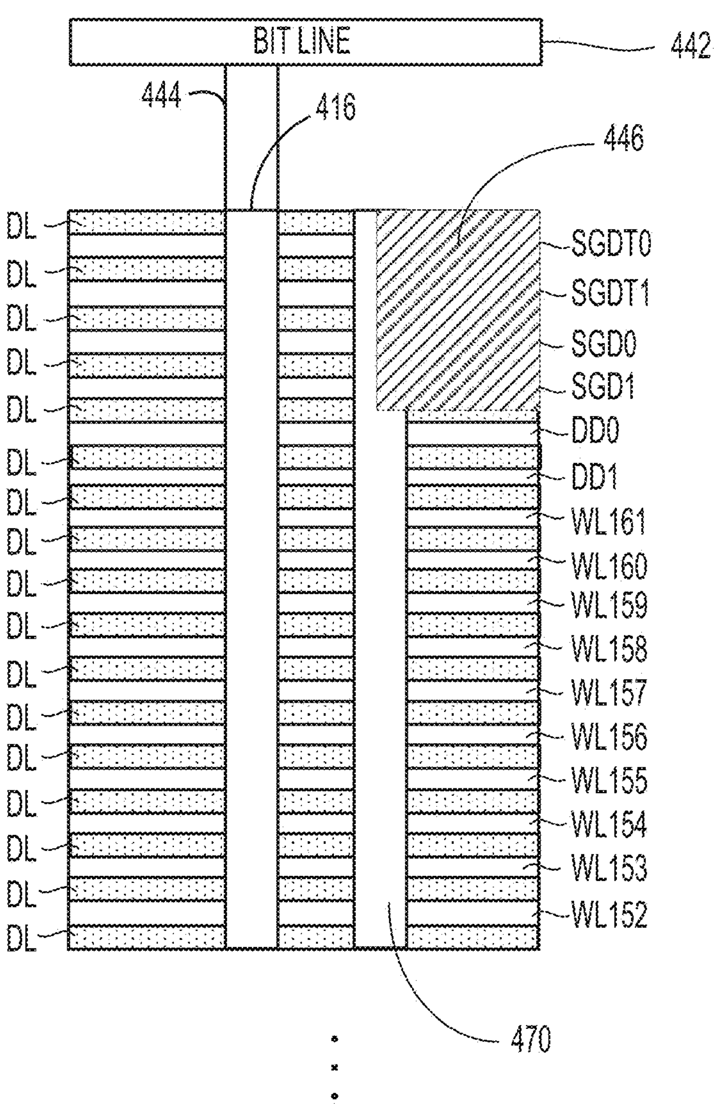
FIG. 4E depicts a cross sectional view of a portion of one embodiment of a block of memory cells.

FIG. 4E depicts a portion of one embodiment of a three dimensional memory structure 202 showing a cross-sectional view along line BB of FIG. 4C. This cross sectional view cuts through memory holes/vertical columns (NAND strings) 416 and 470 of region 454 (see FIG. 4C). FIG. 4E shows the same alternating conductive and dielectric layers as FIG. 4D.

FIG. 4E also shows isolation region 446, which occupies a space that would have been used for a portion of the memory holes/vertical columns/NAND stings, including a space that would have been used for a portion of memory hole/vertical column 470. More specifically, a portion (e.g., half the diameter) of vertical column 470 has been removed in layers SGDT0, SGDT1, SGD0, and SGD1 to accommodate isolation region 446. Thus, while most of the vertical column 470 is cylindrical (has a circular cross section), the portion of vertical column 470 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 454, 456, 458, 460, and 462 (illustrated in FIG. 4C).

Figure 4F:
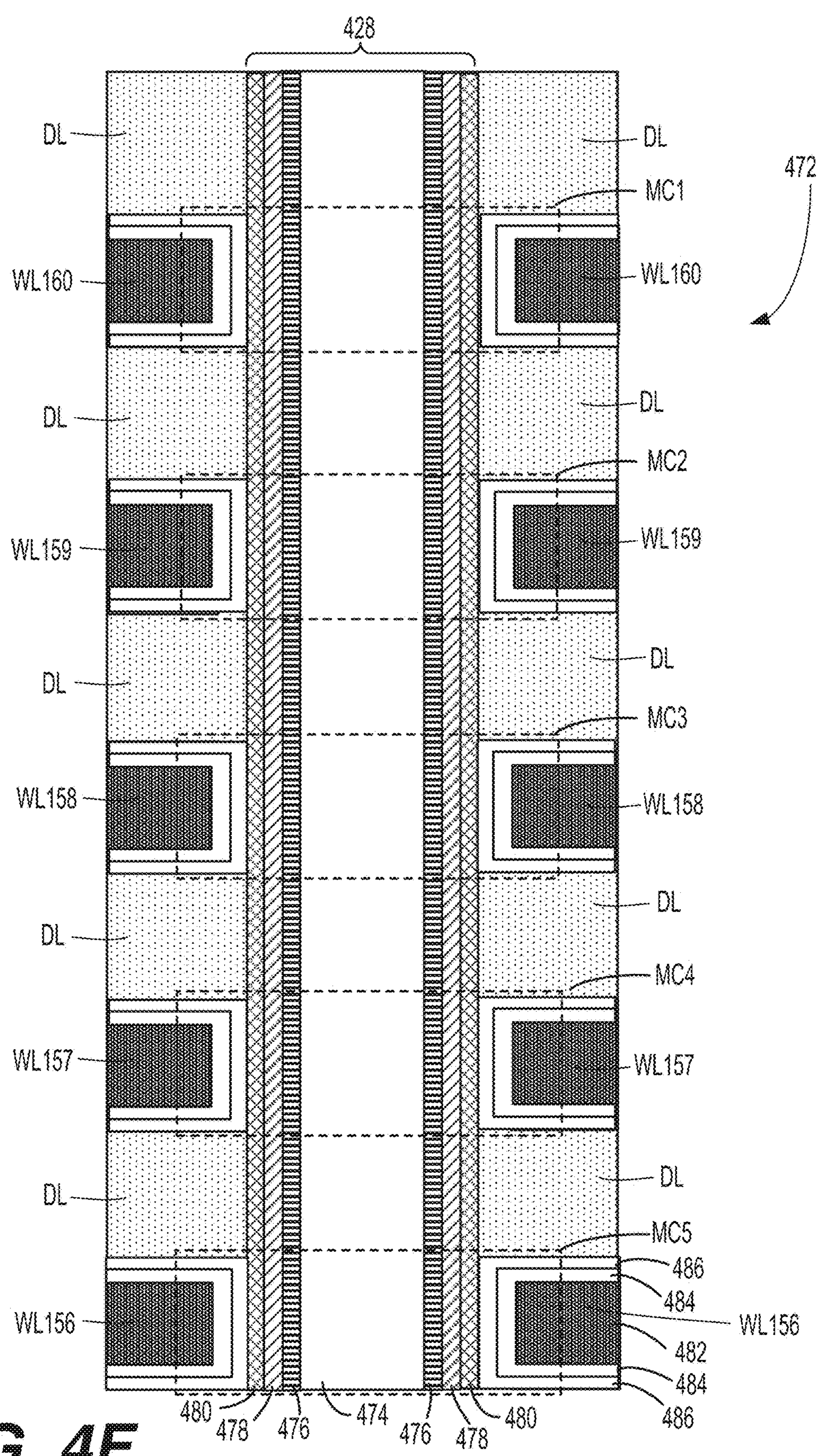
FIG. 4F is a cross sectional view of one embodiment of a vertical column of memory cells.

FIG. 4F depicts a cross sectional view of region 472 of FIG. 4D that includes a portion of memory hole/vertical column 428. In one embodiment, the memory holes/vertical columns are round. However, in other embodiments other shapes can be used. In one embodiment, memory hole/vertical column 428 includes an inner core layer 474 that is made of a dielectric, such as $SiO_2$. Surrounding the inner core 474 is a polysilicon channel 476 (materials other than polysilicon can alternately be used). The channel 476 extends between and is connected with the bit line and the source line. Surrounding the channel 476 is a tunneling dielectric 478 layer, which may have an ONO structure. Surrounding the tunneling dielectric 478 layer is charge trapping layer 480, which may be formed of, for example, Silicon Nitride. It should be appreciated that the technology described herein is not limited to any particular material or structure.

FIG. 4F depicts the dielectric layers DL as well as the word line layers WL160, WL159, WL158, WL157, and WL156. Each of these word line layers includes a word line region 482 surrounded by an aluminum oxide layer 484, which is surrounded by a blocking oxide layer 486. In other embodiments, the blocking oxide layer 486 can be a vertical layer that is parallel with and adjacent to the charge trapping layer 480. The physical interaction of the word line layers with the vertical column forms the memory cells of the NAND string. Thus, in one embodiment a memory cell includes the channel 476, the tunneling dielectric 478, the charge trapping layer 480, the blocking oxide layer 486, the aluminum oxide layer 484, and the word line region 482. For example, word line layer WL160 and a portion of memory hole/vertical column 428 comprise a memory cell MC1. Word line layer WL159 and a portion of memory hole/vertical column 428 comprise a memory cell MC2. Word line layer WL158 and a portion of memory hole/vertical column 428 comprise a memory cell MC3. Word line layer WL157 and a portion of memory hole/vertical column 428 comprise a memory cell MC4. Word line layer WL156 and a portion of memory hole/vertical column 428 comprise a memory cell MC5. In other architectures, a memory cell may have a different structure; however, the memory cell would still be the storage unit.

When a memory cell is programmed, electrons are stored in a portion of the charge trapping layer 480 which is associated with (e.g., in) the memory cell. These electrons are drawn into the charge trapping layer 480 from the channel 476, through the tunneling dielectric 478, in response to an appropriate voltage on word line region 482. The threshold voltage (Vt) of a memory cell is increased in proportion to the amount of stored charge.

In one embodiment, the programming is achieved through Fowler-Nordheim tunneling of the electrons into the charge trapping layer 480. During an erase operation, the electrons return to the channel 476 or holes are injected into the charge trapping layer 480 to recombine with electrons. In one embodiment, erasing is achieved using hole injection into the charge trapping layer 480 via a physical mechanism such as GIDL, as described above.

Figure 4G:
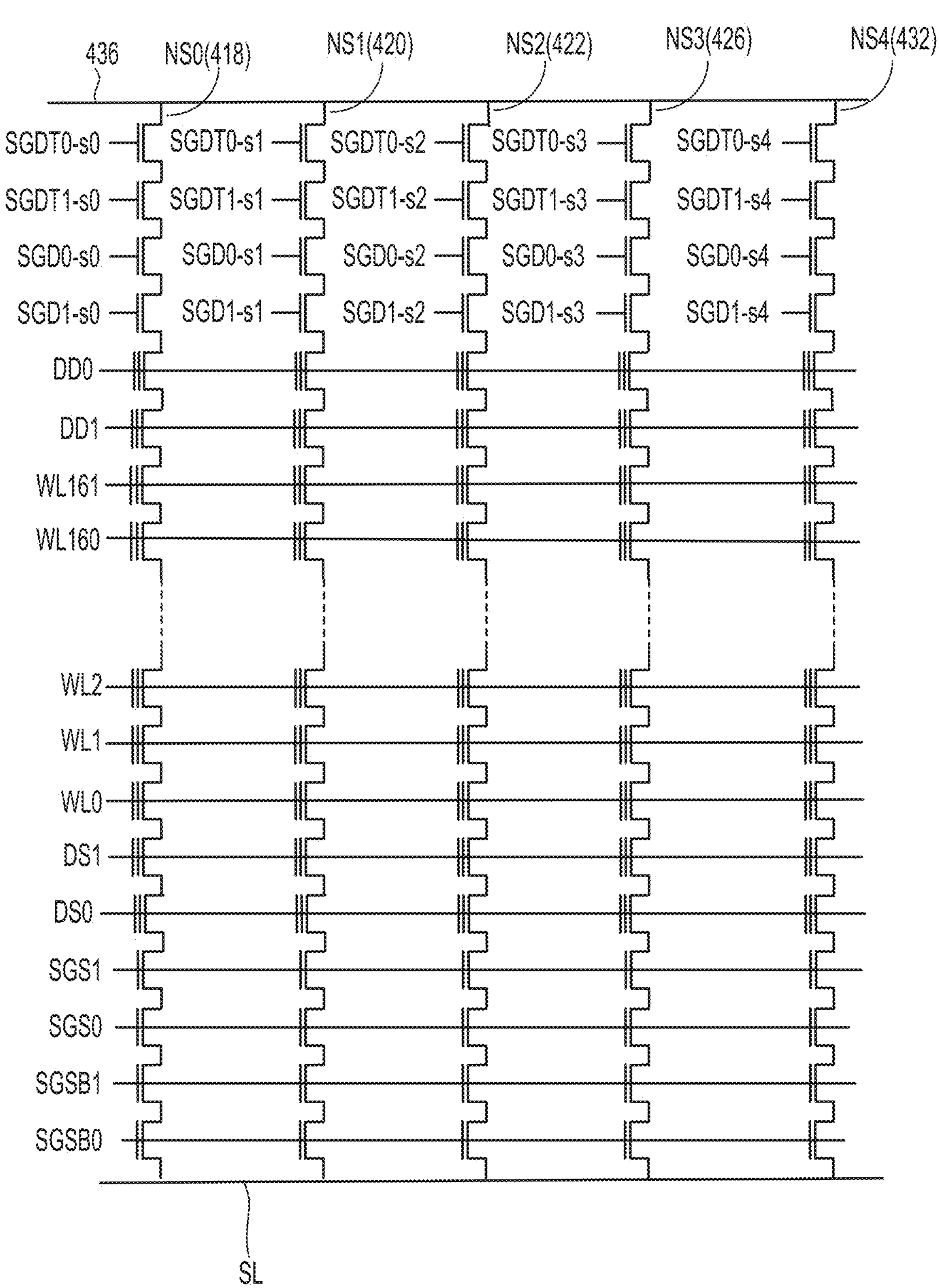
FIG. 4G is a schematic of a plurality of NAND strings in multiple regions of a same block.

FIG. 4G is a schematic diagram of a portion of the three dimensional memory array depicted in in FIGS. 4B-4F. FIG. 4G shows physical data word lines WL0-WL161 running across the entire block. The structure of FIG. 4G corresponds to a portion 412 in Block 2 of FIG. 4B, including bit line 436. Within the block, in one embodiment, each bit line is connected to five NAND strings, one in each region of regions 454, 456, 458, 460, 462 (illustrated in FIG. 4C).

In one embodiment, the programming is achieved through Fowler-Nordheim tunneling of the electrons into the charge trapping layer 480. During an erase operation, the electrons return to the channel 476 or holes are injected into the charge trapping layer 480 to recombine with electrons. In one embodiment, erasing is achieved using hole injection into the charge trapping layer 480 via a physical mechanism such as GIDL, as described above.

FIG. 4G is a schematic diagram of a portion of the three dimensional memory array depicted in in FIGS. 4B-4F. FIG. 4G shows physical data word lines WL0-WL161 running across the entire block. The structure of FIG. 4G corresponds to a portion 412 in Block 2 of FIG. 4B, including bit line 436. Within the block, in one embodiment, each bit line is connected to five NAND strings, one in each region of regions 454, 456, 458, 460, 462 (illustrated in FIG. 4C).

Similarly, the drain side select line/layer SGD1 is separated by isolation regions 446, 448, 450, and 452 (illustrated in FIG. 4C) to form SGD1-*s*0, SGD1-*s*1, SGD1-*s*2, SGD1-*s*3 and SGD1-*s*4 in order to separately connect to and independently control regions 454, 456, 458, 460, 462 (illustrated in FIG. 4C). The drain side GIDL generation transistor control line/layer SGDT0 is also separated by isolation regions 446, 448, 450 and 452 to form SGDT0-*s*0, SGDT0-*s*1, SGDT0-*s*2, SGDT0-*s*3 and SGDT0-*s*4 in order to separately connect to and independently control regions 454, 456, 458, 460, 462. Further, the drain side GIDL generation transistor control line/layer SGDT1 is separated by isolation regions 446, 448, 450 and 452 to form SGDT1-*s*0, SGDT1-*s*1, SGDT1-*s*2, SGDT1-*s*3 and SGDT1-*s*4 in order to separately connect to and independently control regions 454, 456, 458, 460, 462.

FIG. 4G only shows NAND strings connected to bit line 436. However, a full schematic of the block would show every bit line and five vertical NAND strings, which are in separate regions, connected to each bit line.

Although the example memories of FIGS. 4B-4G are three-dimensional memory structures that include vertical NAND strings with charge-trapping material, other (2D and 3D) memory structures can also be used with the technology described herein.

Figure 5:
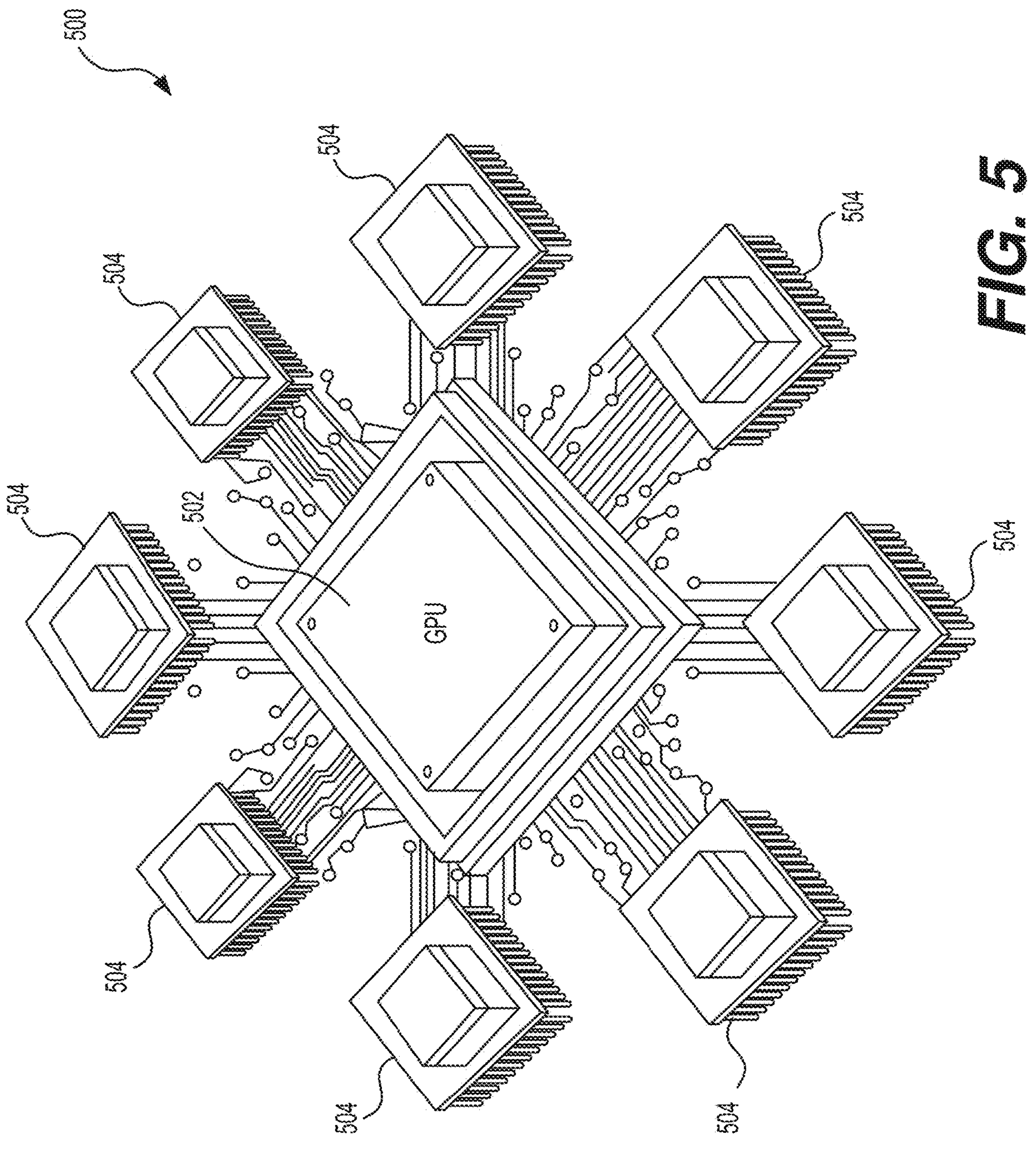
FIG. 5 is a schematic view of an exemplary computing system constructed according to an exemplary embodiment of the present disclosure.

Turning now to FIG. 5, an exemplary embodiment of a computing system 500 is illustrated and that is constructed according to aspects of the present disclosure. The computing system 500 includes a single graphics processor unit (GPU) 502 (or a similar processing unit) and eight non-volatile packages 504, which are all in electrical communication with the single GPU 504. Large language model (LLM) data may be programmed into the non-volatile memory packages 504. In some LLM applications, LLM data is infrequently updated, and thus, there are many read cycles between program and erase cycles. In some embodiments, the computing system can include more or fewer than eight non-volatile packages and may also include one or more high bandwidth memory (HBM) packages that may include, for example, dynamic random access memory (DRAM).

Figure 6:
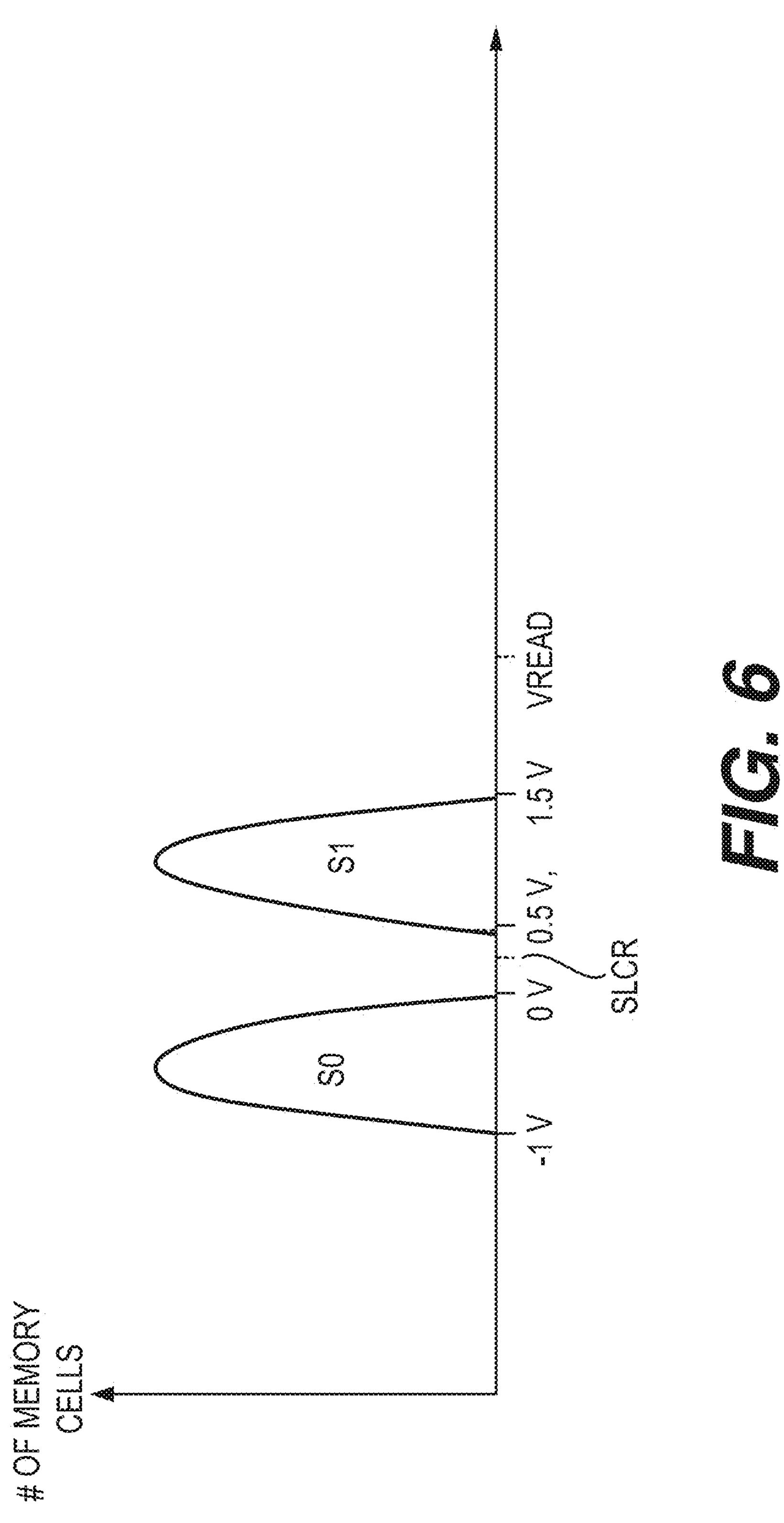
FIG. 6 is a threshold voltage Vt distribution plot of a plurality of memory cells programmed according to a single bit per memory cell (SLC) storage scheme.

The memory cells of a memory device can be programmed to retain one or more bits of data per memory cell. A threshold voltage Vt distribution plot of a one bit per memory cell storage scheme, known as single-level cell (SLC), is depicted in FIG. 6. The SLC storage scheme includes two data states, which are referred to as a first data state S0 and a second data state S1 in the exemplary embodiment. In some embodiments, these data states could have other naming conventions, e.g., erased Er and programmed P. In an example, the first data state S0 is associated with the bit "1" and the second data state S1 is associated with the bit "0." FIG. 6 also depicts a reference voltage SLCR or VCG that is used during a read operation to determine if a memory cell is in the first data state S0 (has a threshold voltage Vt of the memory cell below the reference voltage SLCR) or the second data state S1 (has a threshold voltage Vt of the memory cell above the reference voltage SLCR). In other words, the first data state S0 is associated with a threshold voltage Vt range below the reference voltage SLCR, and the second data state S1 is associated with a threshold voltage Vt range above the reference voltage SLCR. Other storage schemes include two bits per memory cell (MLC), three bits per memory cell (TLC), and four bits per memory cell (QLC). However, the following discussion is related to data stored according to the SLC storage scheme.

Figure 7:
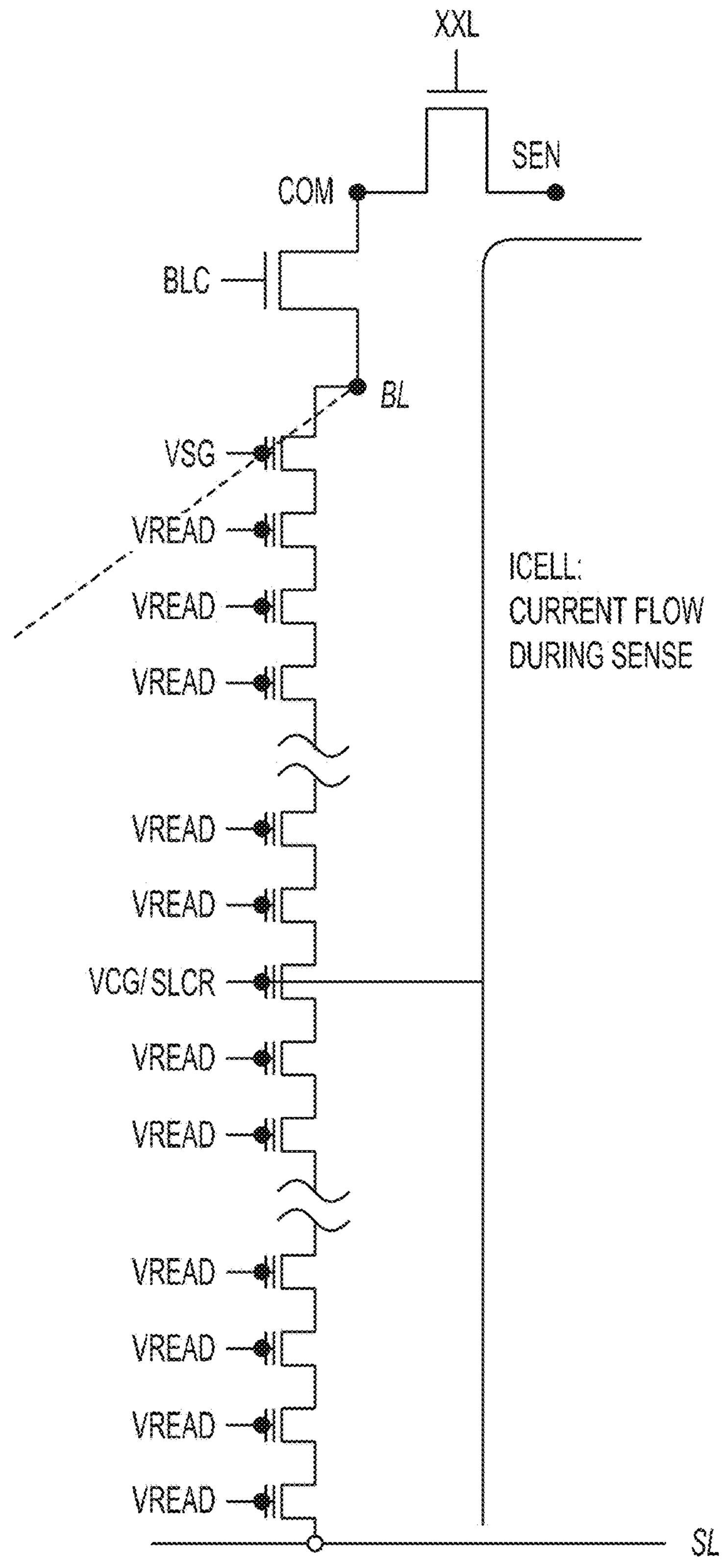
FIG. 7 is a schematic view of an exemplary NAND string during a read operation.

Turning now to FIG. 7, a sensing operation (verify or read) begins with a sense node SEN on the drain side of the memory block being charged to a predetermined charged voltage. Simultaneously, all of the memory cells of a selected NAND string, which contains a selected memory cell of a selected word line WLn, except the selected memory cell are turned on by a pass voltage VREAD. A reference voltage VCG (e.g., SLCR in FIG. 6) is applied to a control gate of the selected word line WLn.

The sense node SEN is then discharged through the NAND string. Since all of the memory cells except the selected memory cell are turned on by the elevated pass voltage VREAD, the discharge current Icell through the NAND string is largely dictated by whether the reference voltage VCG does or does not turn on the selected memory cell, i.e., whether the threshold voltage Vt of the memory cell is below or above the reference voltage VCG.

At a discharge time T_sense, a voltage on the SEN node is sensed by the sensing circuitry and compared to V_sense, which is the threshold voltage Vt of a sensing transistor. If the threshold voltage Vt of the selected memory cell being sensed is higher than the reference voltage VCG, then the selected memory cell was not turned on by the reference voltage VCG and conducts a very small/negligible current resulting in only a small discharge of SEN node voltage. Thus, the SEN node voltage will remain higher than V_sense. On the other hand, if the threshold voltage Vt of the selected memory cell being sensed is lower than the reference voltage VCG, then the reference voltage VCG will turn on the selected memory cell and a larger discharging current will result in the SEN node having a lower voltage than V_sense. This process is performed for each memory cell of the selected word line WLn to read the data stored in the memory cells of the selected word line WLn.

Figures 8A, 8B:
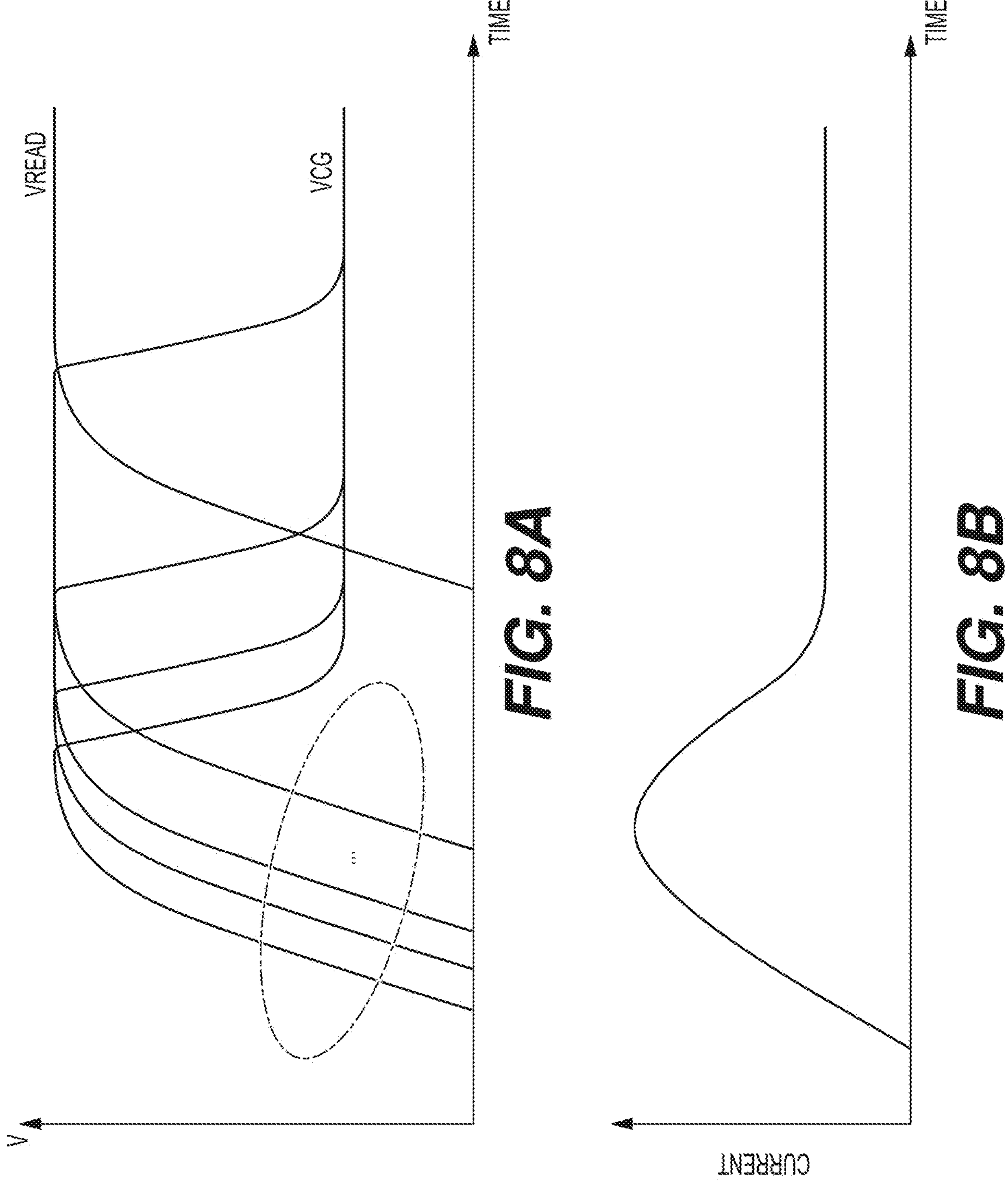
FIG. 8A is a plot of voltage versus time for a plurality of word lines in a plurality of memory blocks during read operations.
FIG. 8B is a plot of overall current versus time during the read operations of FIG. 8A.

At the beginning of a conventional read operation, the word lines of a selected block are ramped up to their respective voltages, i.e., VCG for the selected word line WLn and VREAD for the unselected word lines. During a read operation, peak current consumption Icc occurs during a ramping up process, i.e., when the word lines are ramped to either VCG or VREAD. FIGS. 8A and 8B demonstrate that when memory blocks across numerous planes (for example, 1,000 planes) of a non-volatile memory architecture undergo the ramping up process at the same time, this can lead to a very high peak current consumption ICC.

One strategy to reduce current consumption Icc is to reduce the number of planes that can be read in parallel. However, this approach comes with a downside. Specifically, reducing the number of planes that can operate in parallel has the effect of reducing bandwidth. In other words, there generally exists a tradeoff between bandwidth and current consumption Icc.

The present disclosure is related to read techniques for non-volatile memory devices. These read techniques enable the memory blocks from an increased number of planes to be read in parallel with one another without a corresponding increase in current consumption Icc. Accordingly, these techniques allow for improved bandwidth of the memory device at a reduced current consumption Icc. According to the read techniques of the present disclosure, a read operation is divided into three phases or segments: (1) a block activation phase; (2) a page selection phase; and (3) a block ramp-down or block de-activation phase. The memory device regulates or limits the number of planes that can be active in the page selection phase, which includes the ramping up of the word lines, at one time. This regulation allows for a significant increase in the number of planes that can operate in parallel with a minimal impact on peak current consumption ICC. In other words, the techniques of the present disclosure offer an improved balance of bandwidth and peak current consumption ICC as compared to other known techniques.

Figure 9:
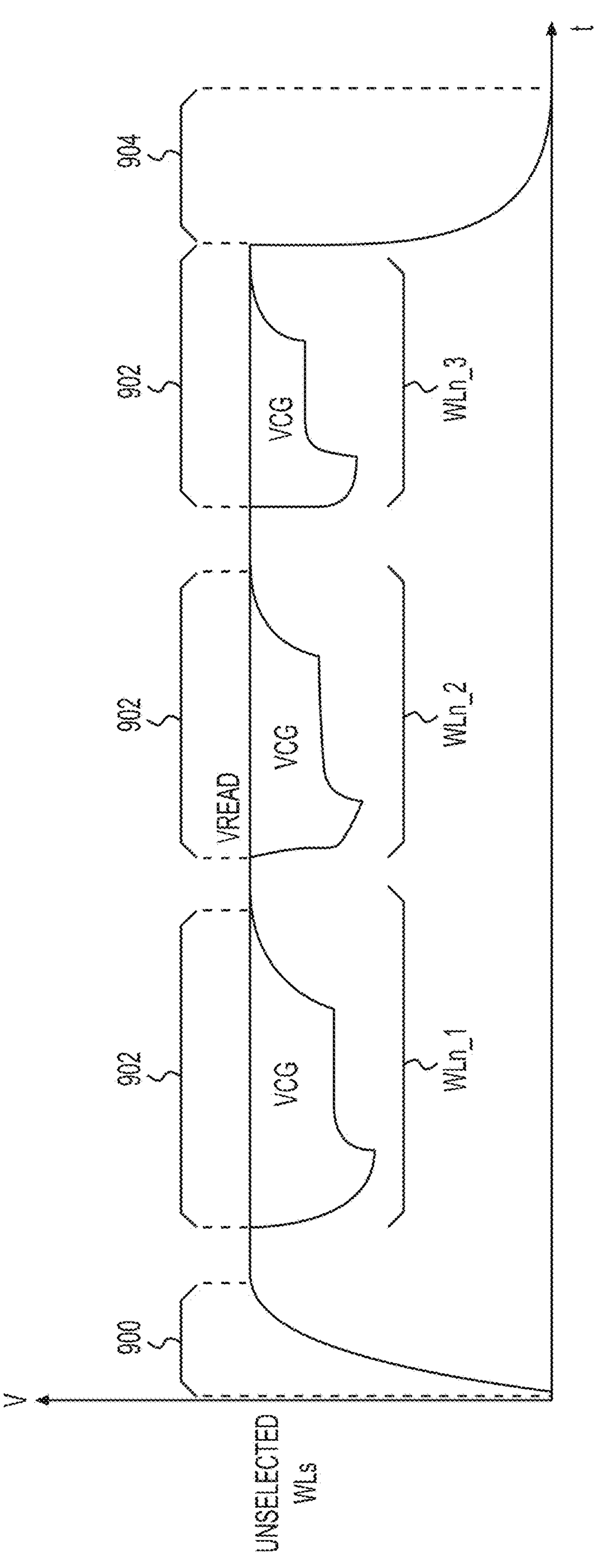
FIG. 9 is a plot of voltage versus time for a plurality of word lines in a memory block during a plurality of read operations according to an exemplary embodiment of the present disclosure.

According to an exemplary embodiment of the present disclosure, instead of ramping down the voltages that are applied to the word lines of a selected memory block between read operations (the block de-activation phase) and then ramping those voltages back up (the block activation phase), all of the word lines of a memory block are maintained or held at the pass voltage VREAD. As depicted in FIG. 9, at the beginning of a first read operation, a first selected word line WLn_1 ramps down from the pass voltage VREAD to the reference voltage VCG and sensing is performed. Upon completion, the first selected word line WLn_1 ramps back up to the pass voltage VREAD (rather than down to a very low voltage as is the case in conventional read operations). During a second read operation, a different, second selected word line WLn_2 ramps down from the pass voltage VREAD to the reference voltage VCG and sensing is performed. Upon completion, the second word line WLn_2 ramps back up to the pass voltage VREAD. During a third read operation, a different, third selected word line WLn_3 is ramped down from the pass voltage VREAD to the reference voltage VCG and sensing is performed. Upon completion, the third selected word line WLn_3 ramps back up to the pass voltage VREAD. This can continue for an indeterminate number of read operations, i.e., two or more read operations.

Thus, according to the exemplary embodiment, multiple read operations (i.e., the page selection phase 902 described above), which require relatively less current consumption, are performed with only a single block activation phase 900 and a single block deactivation phase 904. In other words, the block activation phase 900 and the block deactivation phase 904 are only performed when the selected memory block in a memory plane switches from one memory block to another memory block in the same plane.

Figure 10:
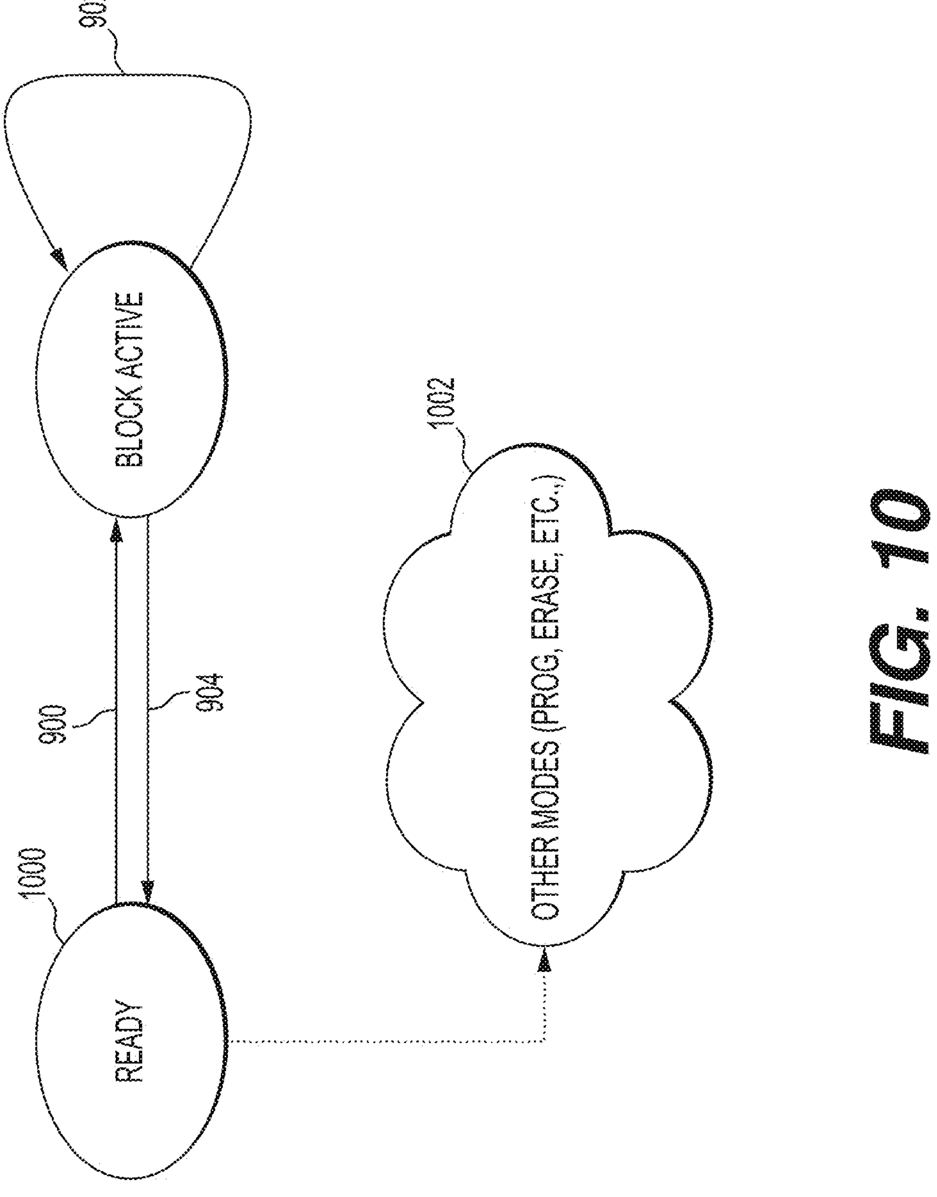
FIG. 10 is a schematic view of an exemplary memory block during the read techniques of the exemplary embodiment of the present disclosure.

FIG. 10 schematically illustrates the read techniques of the present disclosure. In this figure, at step 1000, the block is in a "ready" condition. It can then either undergo a block activation phase 900 to enter a "block active" condition or enter a different operating mode condition 1002 (e.g., erase or program). During the block activation phase 900, all of the word lines of the memory block ramp up (or are raised) from a very low voltage (e.g., 0 V) to the relatively high pass voltage VREAD. In the block active condition, the selected memory block is ready for read operations to be performed.

With the memory block in the "block active" condition, one or more read operations 902 can be performed on the selected memory block. In other words, step 902 can be performed one, two, three, four, or any suitable number of times between the block activation phase 900 and the block de-activation phase 904. When the read operations of the selected memory block are completed and a different memory block in the same plane is to be selected, then at step 904, the selected memory block undergoes a block deactivation phase.

Figure 11:
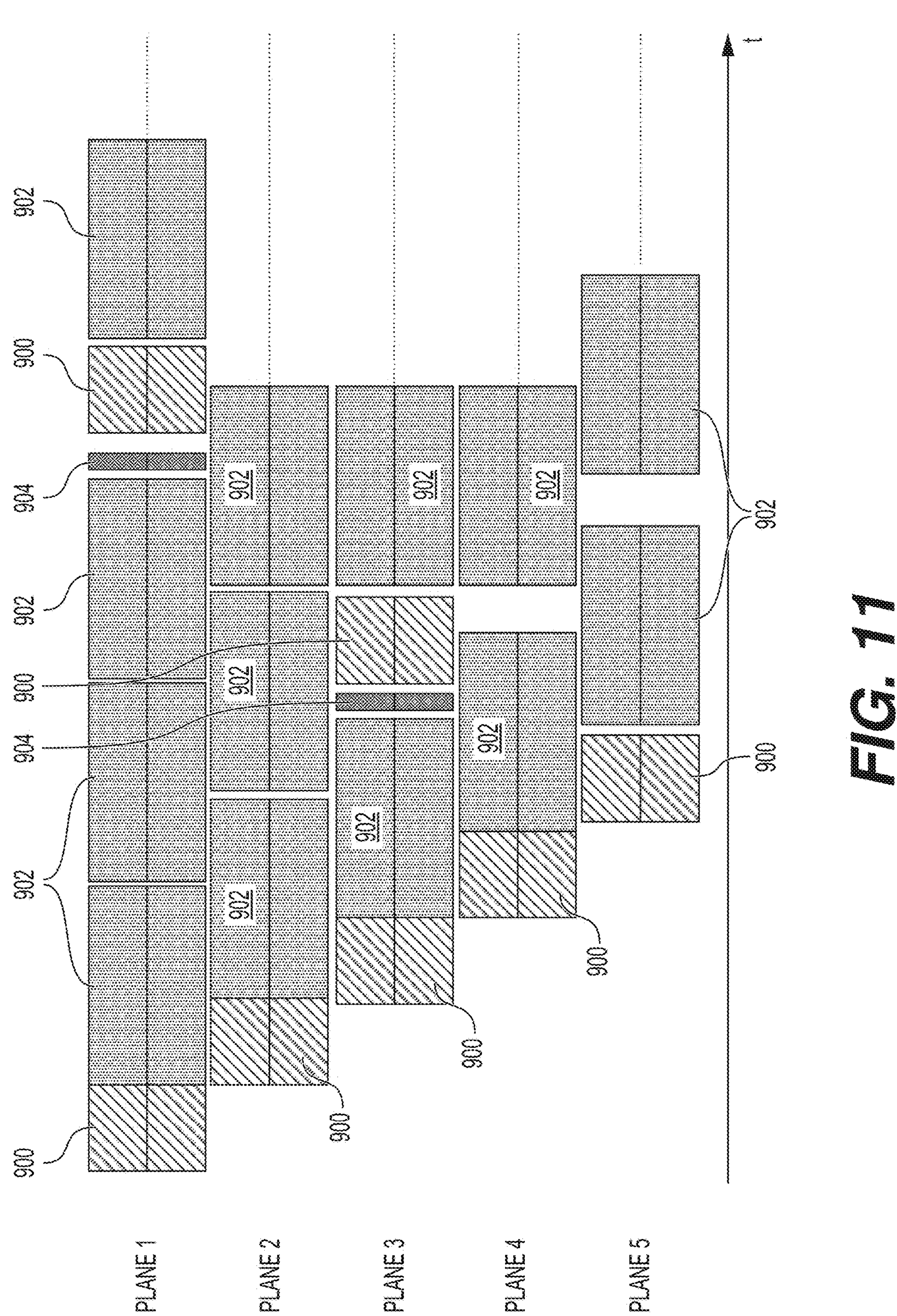
FIG. 11 illustrates the operations of a plurality of planes according to the read techniques of the exemplary embodiment of the present disclosure.

Turning now to FIG. 11, the operation of a plurality of planes (five planes in this example) is demonstrated. As shown, only one plane undergoes the block activation process 900 at a time, while the page selection process 902 can be carried out on any number of planes concurrently. In some embodiments, the number of planes that can undergo the block activation process 900 simultaneously can exceed one (two, three, or more) but it is limited to a maximum number that keeps the peak power consumption Icc below a desired limit or a specified threshold. This strategy allows for high parallelism in the page selection process 902 while managing power consumption Icc effectively.

Figure 12:
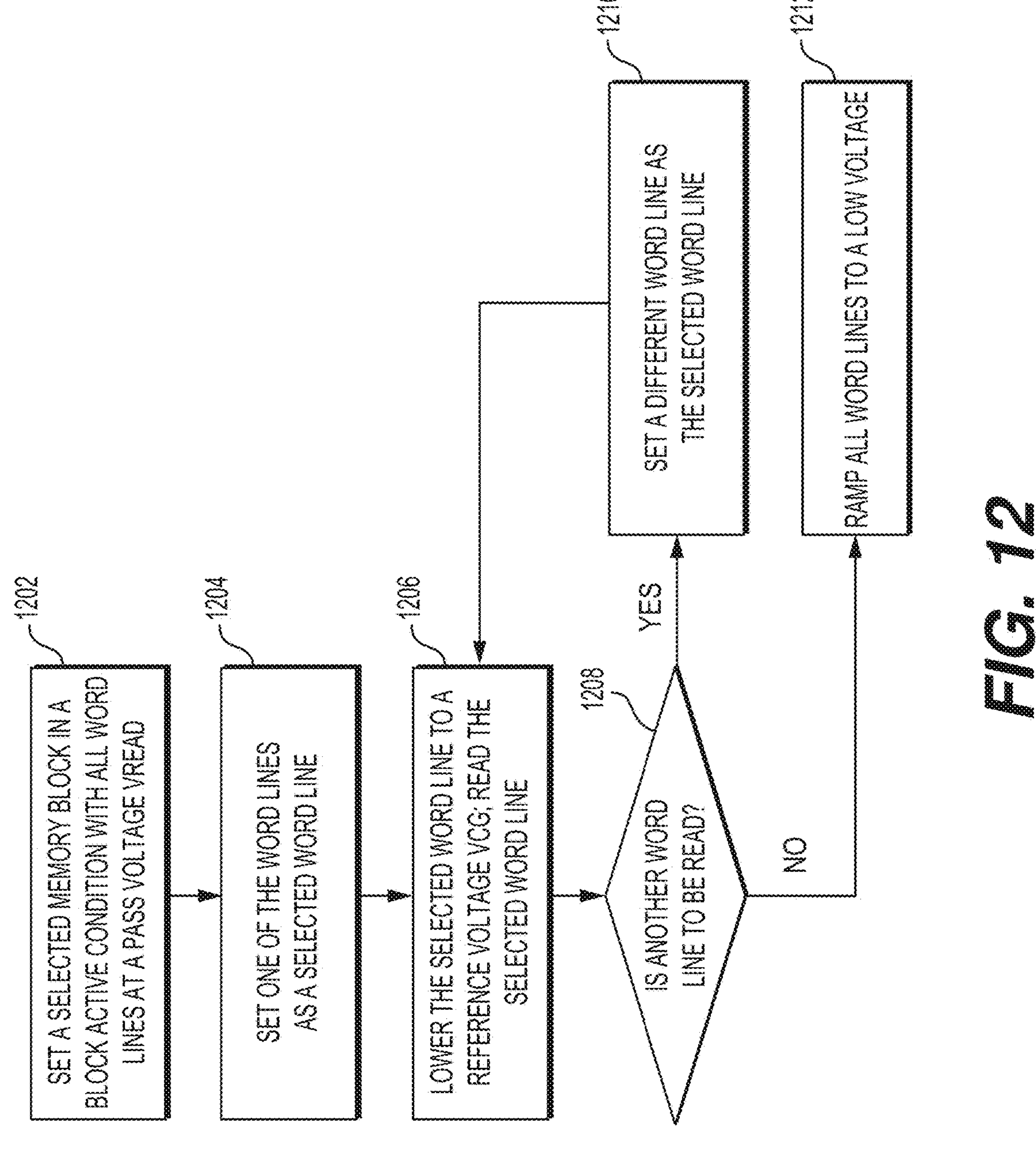
FIG. 12 is a flow chart illustrating the steps of operating a memory device according to an exemplary embodiment of the present disclosure.

FIG. 12 includes a flow chart 1200 depicting the steps of performing a series of read operations in a memory device according to an exemplary embodiment of the present disclosure. These steps could be performed by the controller; a processor or processing device or any other circuitry, executing instructions stored in memory; and/or other circuitry described herein that is specifically configured/programmed to execute the following steps.

At step 1202, a memory block of a plurality of memory blocks in a plane is set as a selected memory block. Also at this step, the selected memory block is set into a block active condition. This includes ramping all of the word lines in the selected memory block from a very low voltage (e.g., approximately 0 V or no more than 2 V) to an elevated pass voltage VREAD.

At step 1204, one of the word lines in the selected memory block is set as a selected word line WLn to be read.

At step 1206, the voltage of the selected word line WLn is lowered from the pass voltage VREAD to a reference voltage VCG. With the selected word line WLn at the reference voltage, a sensing operation is performed to read the data in the selected word line WLn.

At decision step 1208, it is determined if another word line in the selected memory block is to be read. If the answer at decision step 1208 is "yes," then at step 1210, a different word line in the selected memory block is set as the selected word line WLn. The method then returns to step 1206. If the answer at decision step 1208 is "no," then at step 1212, the memory block leaves the block active condition by ramping all of the word lines of the selected memory block to the very low voltage (e.g., approximately 0 V or no more than 2 V).

Figure 13:
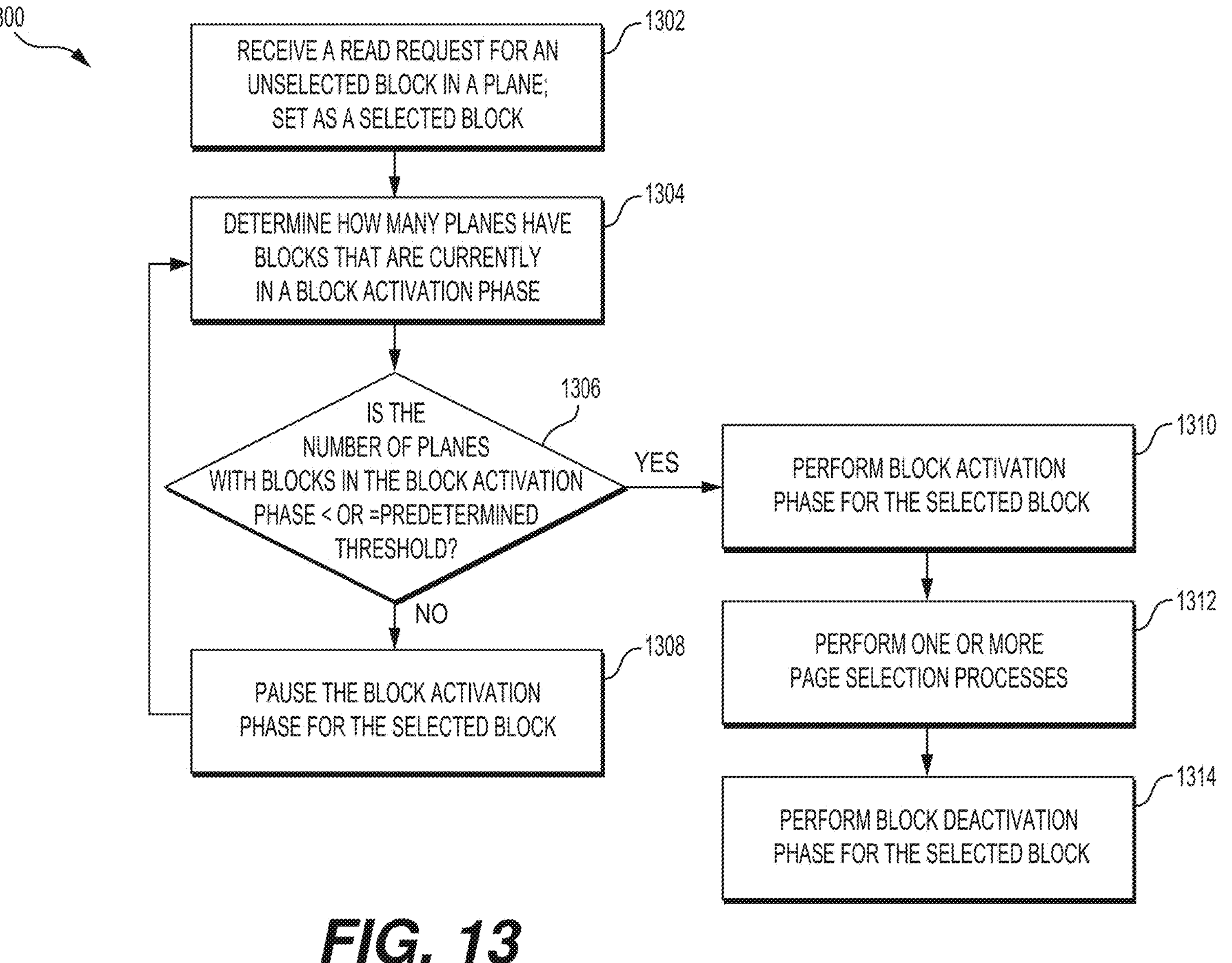
FIG. 13 is a flow chart illustrating the steps of operating a memory device according to another exemplary embodiment of the present disclosure.

FIG. 13 includes a flow chart 1300 depicting the steps of performing a series of read operations in a memory device according to an exemplary embodiment of the present disclosure. These steps could be performed by the controller; a processor or processing device or any other circuitry, executing instructions stored in memory; and/or other circuitry described herein that is specifically configured/programmed to execute the following steps.

At step 1302, a read request is received for a currently unselected memory block of a plurality of memory of memory blocks in a plane. At step 1304, it is determined how many planes of a plurality of planes currently have a memory block in a block activation phase to establish a count.

At decision step 1306, it is determined if the number of planes with memory blocks in the block activation phase (i.e., the count) is less than a predetermined threshold. The predetermined threshold is a maximum number of memory blocks in the memory device that can be in the block activation phase at any one time and is set at a level that prevents peak current consumption from spiking above a desired limit.

If the answer at decision step 1306 is "no," then at step 1308, activation of the selected memory block is paused for a predetermined period of time and then the process returns to step 1304.

If the answer at decision step 1306 is "yes," then at step 1310, the block activation phase begins for the selected memory block.

At step 1312, one or more page selection phases (read operations) are performed on one or more word lines of the selected memory block.

At step 1314, a block deactivation phase is performed on the selected memory block.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on." For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method of operating a memory device, comprising the steps of:

preparing a plurality of planes, each of the planes having a plurality of memory blocks;

receiving a read command for a selected memory block of the plurality of planes;

determining a count of planes of the plurality of planes that have memory blocks undergoing a block activation process, the block activation process including ramping a plurality of word lines to a pass voltage;

in response to the count being below or equal to a predetermined threshold, beginning the block activation process for the selected memory block; and in response to the count being above the predetermined threshold, delaying the block activation process for the selected memory block until the number of planes that have memory blocks undergoing the block activation process is below the predetermined threshold.

2. The method as set forth in claim 1, wherein following the block activation process, at least one sensing operation is performed on at least one word line of the plurality of word lines of the selected memory block prior to a block deactivation process.

3. The method as set forth in claim 2, wherein the at least one sensing operation includes a plurality of sensing operations.

4. The method as set forth in claim 2, wherein the at least one sensing operation includes ramping a voltage applied to a selected word line from the pass voltage to a reference voltage.

5. The method as set forth in claim 2, wherein the block deactivation process includes ramping the plurality of word lines from the pass voltage to no more than two Volts.

6. The method as set forth in claim 1, wherein in each of the planes, the plurality of memory blocks share a common set of bit lines.

7. The method as set forth in claim 1, wherein the predetermined threshold is greater than one.

8. A memory device, comprising:

a plurality of planes, each of the planes having a plurality of memory blocks, the memory blocks including arrays of memory cells that are arranged in a plurality of word lines; and circuitry that is configured to read data of the memory cells, the circuitry being configured to;

receive a read command for a selected memory block of the plurality of planes, determine a count of planes of the plurality of planes that have memory blocks undergoing a block activation process, the block activation process including ramping the plurality of word lines to a pass voltage, in response to the count being below or equal to a predetermined threshold, begin the block activation process for the selected memory block, and in response to the count being above the predetermined threshold, delay the block activation process for the selected memory block until the number of planes that have memory blocks undergoing the block activation process is below the predetermined threshold.

9. The memory device as set forth in claim 8, wherein following the block activation process, the circuitry is configured to perform at least one sensing operation on at least one word line of the plurality of word lines of the selected memory block prior to a block deactivation process.

10. The memory device as set forth in claim 9, wherein the at least one sensing operation includes a plurality of sensing operations.

11. The memory device as set forth in claim 9, wherein the at least one sensing operation includes ramping a voltage applied to a selected word line from the pass voltage to a reference voltage.

12. The memory device as set forth in claim 9, wherein the block deactivation process includes the circuitry ramping the plurality of word lines from the pass voltage to no more than two Volts.

13. The memory device as set forth in claim 8, wherein in each of the planes, the plurality of memory blocks share a common set of bit lines.

14. The memory device as set forth in claim 8, wherein the predetermined threshold is greater than one.

15. A computing system comprising, comprising:

at least one non-volatile memory device that includes a plurality of planes, each of the planes having a plurality of memory blocks, the memory blocks including arrays of memory cells that are arranged in a plurality of word lines; and circuitry that is configured to read data of the memory cells, the circuitry being configured to;

receive a read command for a selected memory block of the plurality of planes, determine a count of planes of the plurality of planes that have memory blocks undergoing a block activation process, the block activation process including ramping the plurality of word lines to a pass voltage, in response to the count being below or equal to a predetermined threshold, begin the block activation process for the selected memory block, and in response to the count being above the predetermined threshold, delay the block activation process for the selected memory block until the number of planes that have memory blocks undergoing the block activation process is below the predetermined threshold.

16. The computing system as set forth in claim 15, wherein following the block activation process, the circuitry is configured to perform at least one sensing operation on at least one word line of the plurality of word lines of the selected memory block prior to a block deactivation process.

17. The computing system as set forth in claim 16, wherein the at least one sensing operation includes a plurality of sensing operations.

18. The computing system as set forth in claim 16, wherein the at least one sensing operation includes ramping a voltage applied to a selected word line from the pass voltage to a reference voltage.

19. The computing system as set forth in claim 16, wherein the block deactivation process includes the circuitry ramping the plurality of word lines from the pass voltage to no more than two Volts.

20. The computing system as set forth in claim 15, wherein in each of the planes, the plurality of memory blocks share a common set of bit lines.

* * * * *